(12) United States Patent
Kamata

(10) Patent No.: US 6,784,705 B2
(45) Date of Patent: Aug. 31, 2004

(54) POWER ON RESET CIRCUIT

(75) Inventor: Yoshihiko Kamata, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/352,229

(22) Filed: Jan. 28, 2003

(65) Prior Publication Data
US 2003/0189450 A1 Oct. 9, 2003

(30) Foreign Application Priority Data
Apr. 8, 2002 (JP) ........................................ 2002-104658

(51) Int. Cl.7 ................................................. H03L 7/00
(52) U.S. Cl. ....................................... 327/143; 327/198
(58) Field of Search ................................ 327/142, 143, 327/198; 365/227

(56) References Cited

U.S. PATENT DOCUMENTS 6,147,516 A  * 11/2000  Chang ........................... 327/62
6,628,152 B1 *  9/2003  Kern et al. ................... 327/143

* cited by examiner

Primary Examiner—Quan Tra
(74) Attorney, Agent, or Firm—Rabin & Berdo, P.C.

(57) ABSTRACT

A POR circuit includes a signal generator which has a PMOS transistor and a first and second resistors connected in series. The PMOS transistor is controlled in accordance with a DPWD signal. A first signal obtained by dividing a voltage difference between the ground voltage and the supply voltage is output from a first node between the first and second resistors. The POR circuit also includes an edge generator which includes a third resistor and an NMOS transistor connected in series, and an inverter coupled to a second node between the third resistor and the NMOS transistor. The NMOS transistor is controlled in accordance with a voltage of the first signal output from the first node. When the NMOS transistor turns on, a second signal having an edge waveform is generated at the second node, the first inverter outputs a third signal which is a reversal of the second signal. The POR circuit also includes a delay circuit which receives the DPWD signal and outputs a DLDPWD signal, a charging circuit which is connected in parallel to the first resistor so that the first node can be charged, and an output inhibit circuit which outputs an edge waveform contained in the third signal as a reset signal when changing from the power-off state to the power-on state, and does not output the reset signal when the voltage of the DPWD signal changes from high to low.

28 Claims, 38 Drawing Sheets

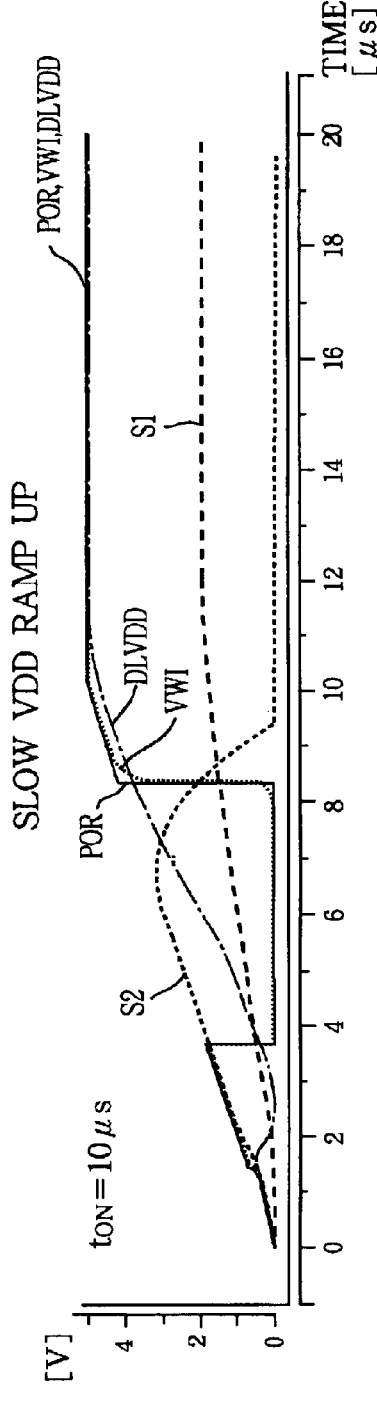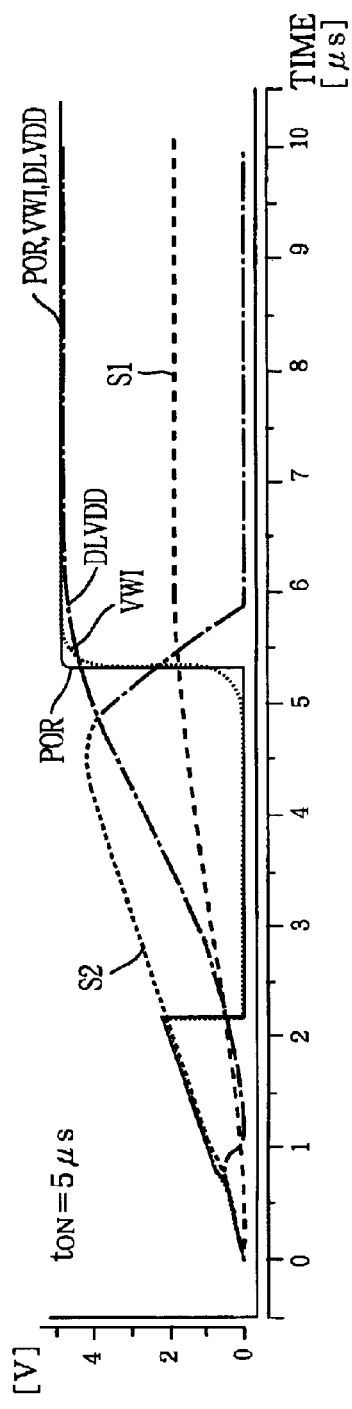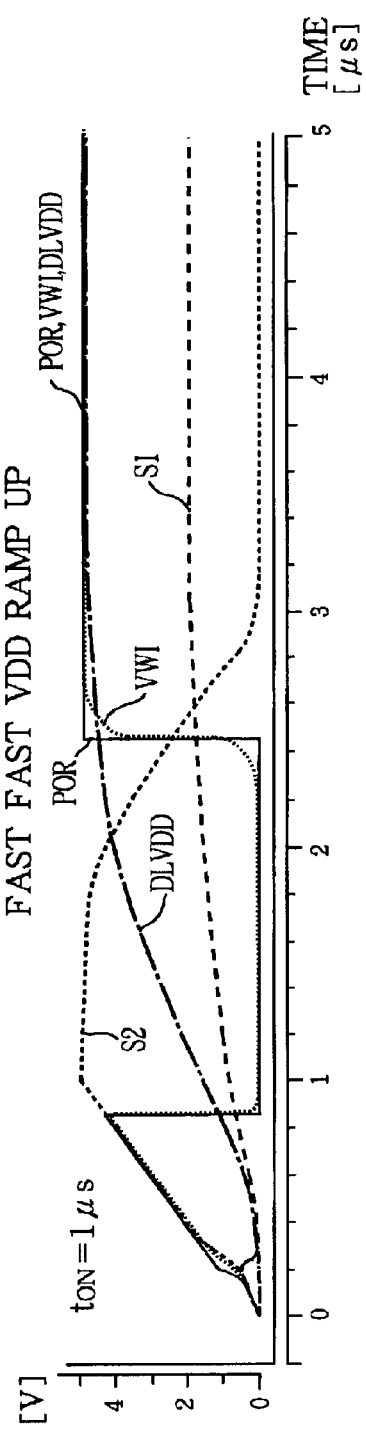

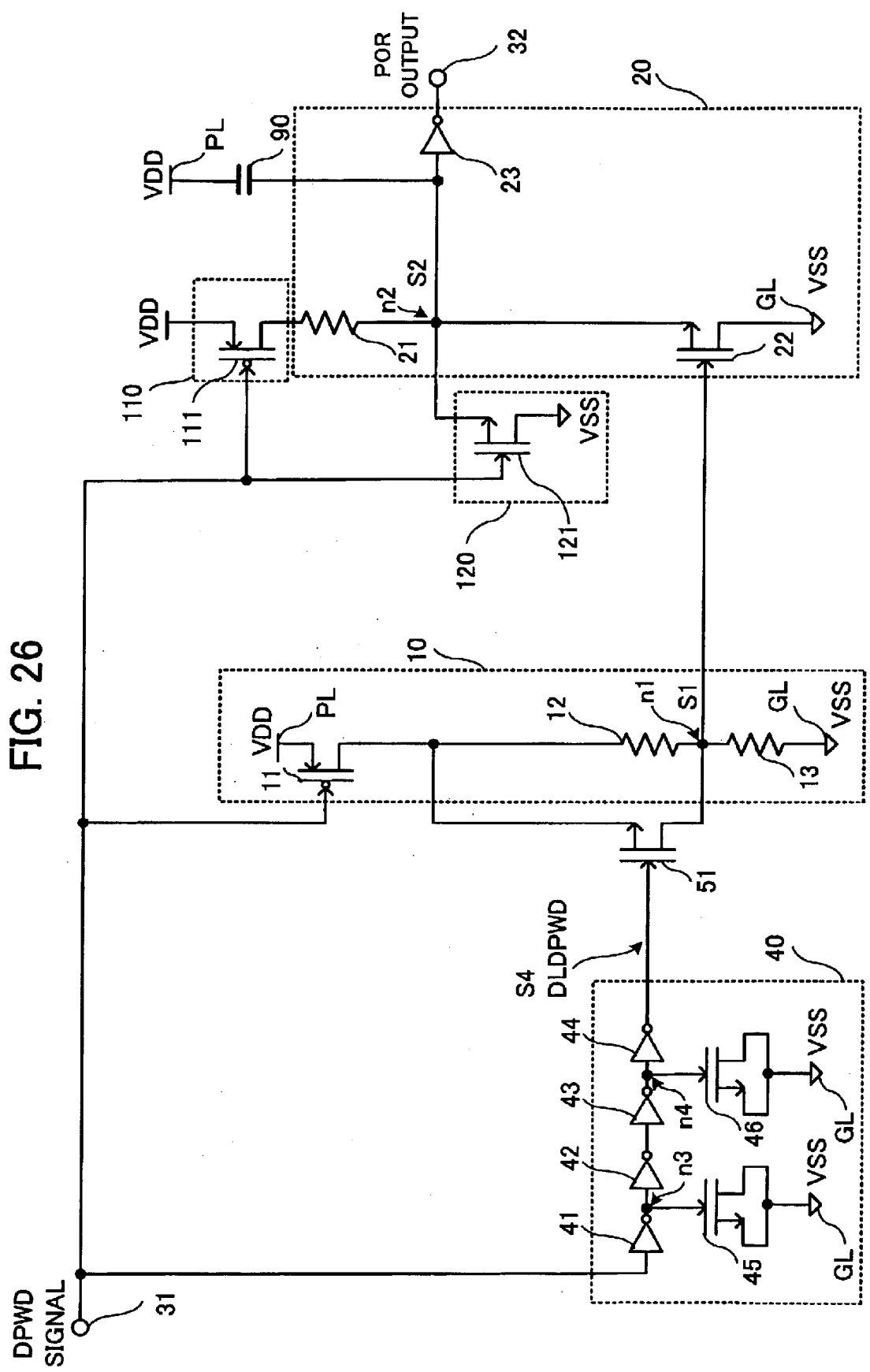

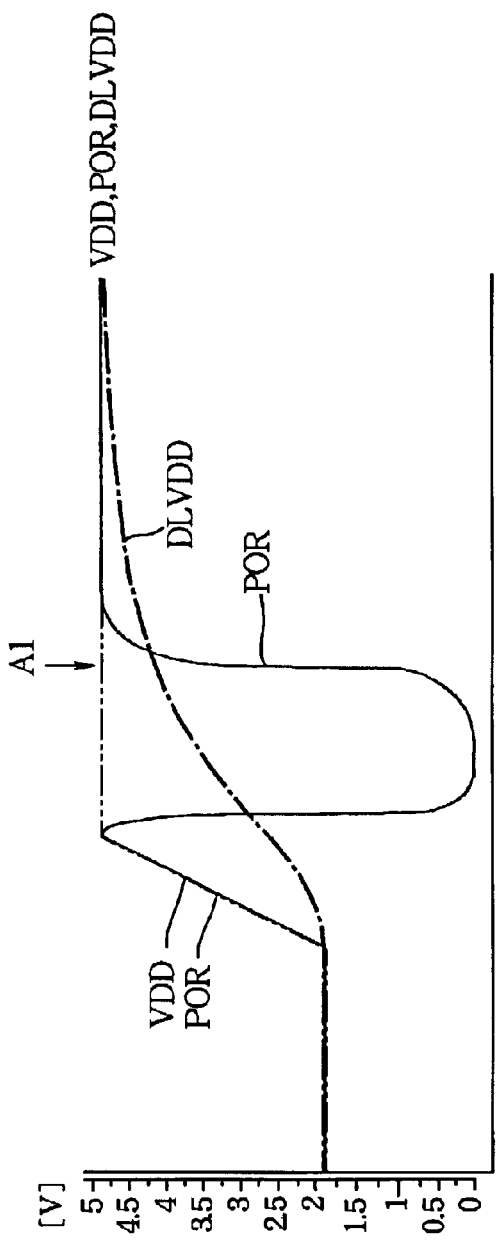
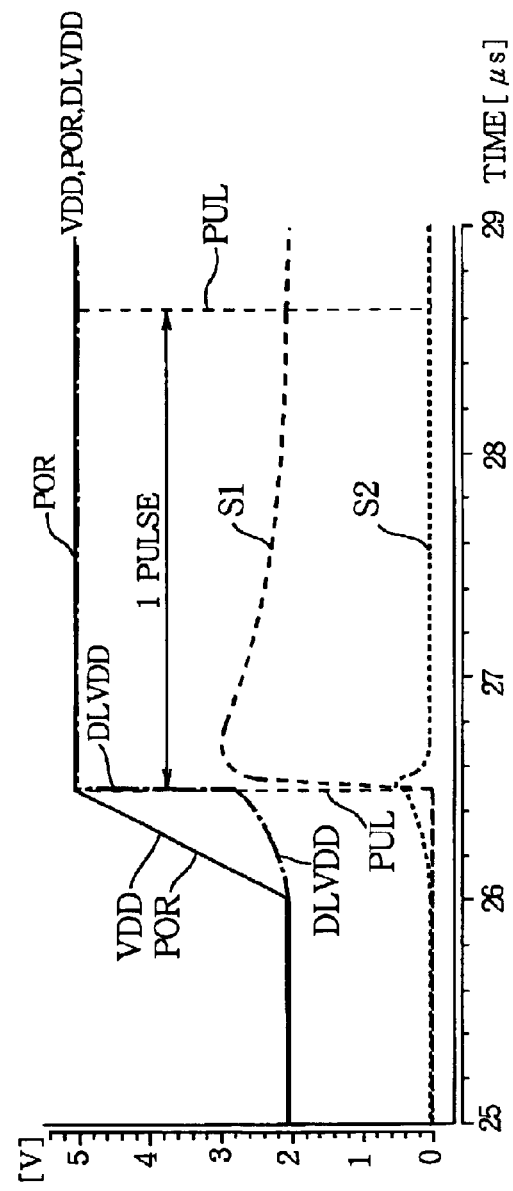
FIG. 34A
FIG. 34B

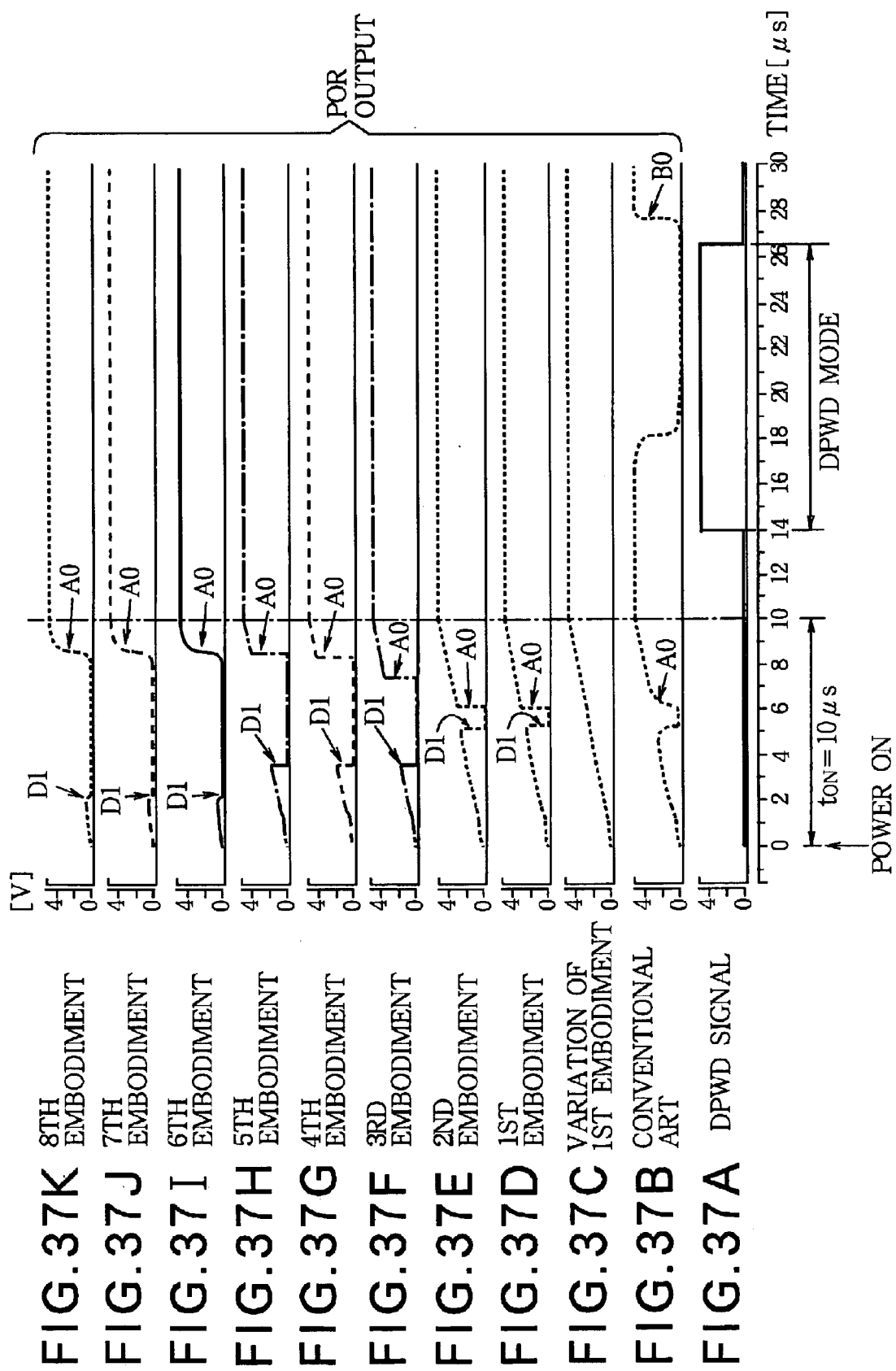

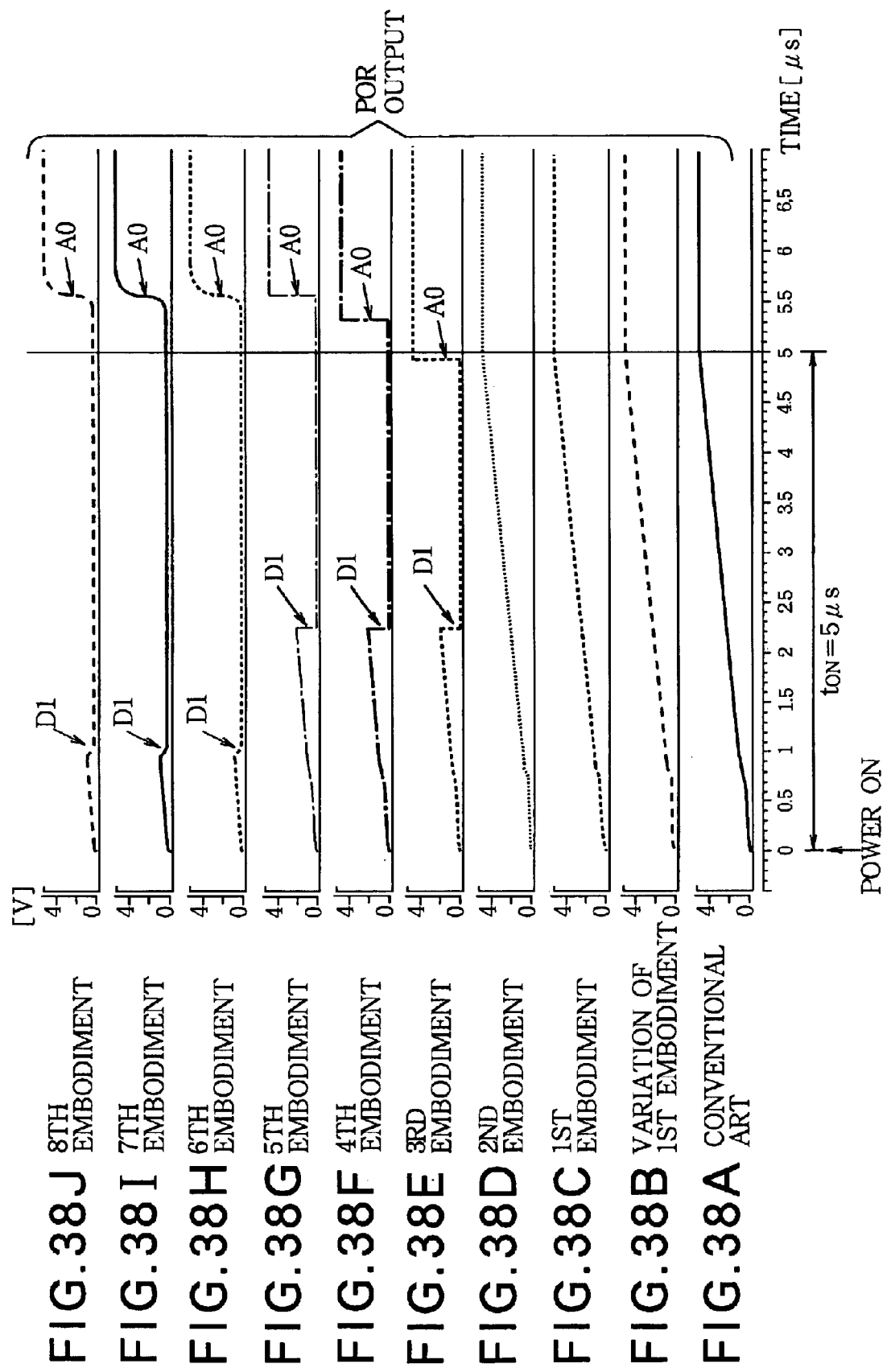

POWER ON RESET CIRCUIT

BACKGROUND OF THE INVENTION

1. Field of the Invention

The present invention relates to a power on reset (POR) circuit which is mounted on a semiconductor integrated circuit and generates a reset signal (a rising edge waveform or a falling edge waveform) when it detects a ramp-up or a ramp-down of the supply voltage at power-on of the semiconductor integrated circuit.

2. Description of the Related Art

FIG. 1 is a circuit diagram showing a configuration of a conventional POR circuit. FIG. 2 shows simulated waveforms obtained from the POR circuit of FIG. 1 when the power is turned on, with the voltage rise time $t_{ON}$ of 10 µs, and at restoration from the deep power down (DPWD) mode. FIGS. 3A, 3B, and 3C show simulated waveforms obtained from the POR circuit of FIG. 1 when the power is turned on, with the voltage rise time $t_{ON}$ of 50 µs, 10 µs, and 5 µs, respectively.

As shown in FIG. 1, the POR circuit includes a signal generator 10 having a PMOS transistor 11, a resistor 12, and a resistor 13, and an edge generator 20 having a resistor 21, an NMOS transistor 22, and an inverter 23.

When the semiconductor integrated circuit containing the POR circuit of FIG. 1 is powered up (during a period of 0 to 10 µs on the time axis shown in FIG. 2), the ground line GL carries a ground voltage VSS (0 V, for instance), and the supply voltage VDD of the power supply line PL changes from low (L) level (0 V, for instance) to high (H) level (5 V, for instance). In the meantime, the DPWD signal input to the DPWD input port 31 is at low level (0 V, for instance). As the supply voltage VDD rises, a voltage of a first signal S1 generated at a first node n1 increases from the ground voltage VSS, increasing a voltage of a second signal S2 generated at a second node n2. Then, when the NMOS transistor 22 turns on, the voltage of the second signal S2 at the second node n2 decreases, causing the inverter 23 to generate a rising edge waveform. The rising edge waveform (i.e., a reset signal) A0(10) or A0(50) is output as a POR output from the POR output port 32 at about a time point of 6 µs on the time axis shown in FIG. 2 or FIG. 3B, or at about a time point of 29 µs on the time axis shown in FIG. 3A. When receiving the reset signal (the edge waveform A0(10) or A0(50), for instance), the semiconductor integrated circuit returns its state to a prescribed initial state.

The DPWD mode belongs to a power-saving mode of the semiconductor integrated circuit. In the DPWD mode, since the DPWD signal applied to the DPWD input port 31 is at high level (5 V, for instance), a penetration current that would flow from the power supply line PL to the ground line GL is eliminated in the POR circuit. When the semiconductor integrated circuit is restored from the DPWD mode (during a period of 14 µs to 26.5 µs on the time axis shown in FIG. 2), the DPWD signal input to the POR circuit is switched from high level to low level. After that, the voltage of the first signal S1 at the first node n1 gradually increases. Then, when the NMOS transistor 22 turns on, the voltage of the second signal S2 at the second node n2 decreases, causing the inverter 23 to generate a rising edge waveform. The rising edge waveform (i.e., a reset signal) B0 is output as a POR output from the POR output port 32 at about a time point of 27.5 µs on the time axis shown in FIG. 2.

As has been described above, the POR circuit shown in FIG. 1 outputs the reset signal even at restoration from the DPWD mode. However, because the DPWD mode belongs to a power-saving mode, after restoration from the DPWD mode, there are needs for continuing the processing that were being performed before the transition to the DPWD mode, that is, needs for inhibiting the output of the reset signal at restoration from the DPWD mode.

As shown in FIGS. 3A and 3B, the POR circuit shown in FIG. 1 can generate an edge waveform as a reset signal if the rise time $t_{ON}$ of the supply voltage VDD at power-on long enough (50 µs or 10 µs, for instance). If the supply voltage VDD quickly rises, that is, if the rise time $t_{ON}$ is short (5 µs, for instance), as shown in FIG. 3C, an edge waveform as a reset signal cannot be generated.

SUMMARY OF THE INVENTION

It is an object of the present invention to provide a POR circuit which outputs a reset signal at power-on of the semiconductor integrated circuit and does not output a reset signal at restoration from the DPWD mode.

It is another object of the present invention to provide a POR circuit which can reliably output a reset signal even when the supply voltage quickly rises at power-on of the semiconductor integrated circuit.

According to the present invention, a POR circuit includes a power supply line; a first port to which a power-saving mode signal is input; a second port from which a reset signal is output; a signal generator which is controlled in accordance with the power-saving mode signal to generate a control signal; an edge generator which is controlled in accordance with the control signal to generate an edge signal; a first delay circuit which outputs a delayed power-saving mode signal obtained by delaying the power-saving mode signal; a charging circuit which is controlled in accordance with the delayed power-saving mode signal to speed up charging of a first node where the control signal is generated at restoration from the power-saving mode; and an output inhibit circuit which outputs an edge waveform as a reset signal from the second port during a period of changing from a power-off state, in which no power is supplied to the power supply line, to a power-on state, in which power is supplied to the power supply line, and does not output the reset signal from the second port when a voltage of the power-saving mode signal is changed.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 18A, 18B, and 18C show simulated waveforms obtained from the POR circuit of the fourth embodiment when the power is turned on, with the voltage rise time of 10 $\mu$s, 5 $\mu$s, and 1 $\mu$s, respectively;

FIG. 26 is a circuit diagram showing a configuration of a variation of the POR circuit of the sixth embodiment;

FIGS. 34A and 34B show waveforms for describing a function of the POR circuit of the eighth embodiment;

FIG. 37A shows a waveform of the DPWD signal;

FIGS. 37B to 37K show waveforms of simulated POR output of the POR circuits of conventional art and of the first to eighth embodiments respectively, when the power is turned on, with the voltage rise time of 10 $\mu$s, and at restoration from the DPWD mode; and FIGS. 38A to 38J show waveforms of simulated POR output of the POR circuits of conventional art and of the first to eighth embodiments respectively, when the power is turned on, with the voltage rise time of 5 $\mu$s.

DETAILED DESCRIPTION OF PREFERRED EMBODIMENTS

Further scope of applicability of the present invention will become apparent from the detailed description given hereinafter. However, it should be understood that the detailed description and specific examples, while indicating preferred embodiments of the invention, are given by way of illustration only, since various changes and modifications will become apparent to those skilled in the art from the detailed description.

<First Embodiment>

Figure 4:
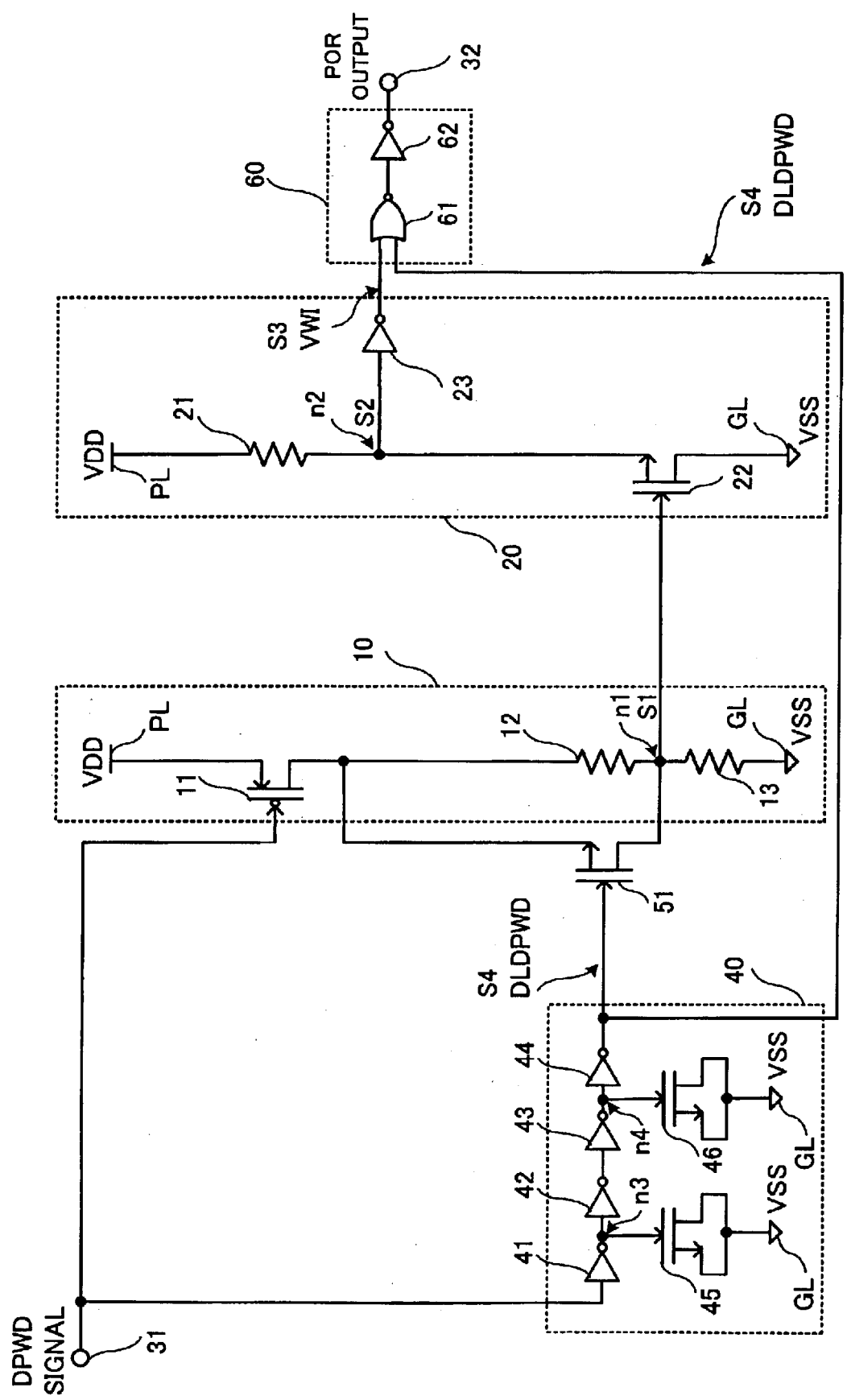
FIG. 4 is a circuit diagram showing a configuration of a POR circuit in accordance with the first embodiment of the present invention.

FIG. 4 is a circuit diagram showing a configuration of a POR circuit in accordance with the first embodiment of the present invention. FIGS. 5A to 5D show simulated waveforms obtained from the POR circuit of the first embodiment when the power is turned on, with the voltage rise time $t_{ON}$ of 10 µs, and at restoration from the DPWD mode.

The POR circuit of the first embodiment is mounted as a part of a semiconductor integrated circuit such as a flash ROM, for instance. The semiconductor integrated circuit includes a ground line which is at ground voltage, a power supply line (or a power supply circuit) which supplies a supply voltage, and a control signal line (or a control signal generator) which supplies the DPWD signal for switching the DPWD mode as a power-saving mode or the normal operation mode. The type of the semiconductor integrated circuit is not limited to a flash ROM. The supply voltage VDD is a positive voltage in the following description, but the POR circuit may be configured so that the supply voltage is a negative voltage. In addition, the POR circuit may also be configured with inverted logic levels.

As shown in FIG. 4, the POR circuit of the first embodiment includes a ground line GL to which a ground voltage VSS is applied, a power supply line PL to which a supply voltage VDD is applied, a DPWD input port 31 to which a DPWD signal is input, and a POR output port 32 from which a reset signal is output. The DPWD signal input to the DPWD input port 31 is at high level during the on-state of the DPWD mode, and is at low level during the off-state of the DPWD mode. The reset signal output from the POR output port 32 is a rising edge waveform or a falling edge waveform (hereafter, a rising edge waveform is referred to as a reset signal).

As shown in FIG. 4, the POR circuit of the first embodiment further includes a signal generator 10 for generating a first signal S1. The signal generator 10 includes a PMOS transistor (FET) 11, a resistor 12, and a resistor 13 connected in series between the power supply line PL and the ground line GL. The gate of the PMOS transistor 11 is coupled to the DPWD input port 31. The PMOS transistor 11 turns on when the DPWD signal applied to the DPWD input port 31 is at low level, and turns off when the DPWD signal is at high level (i.e., during the DPWD mode). The voltage of the first signal S1 is obtained by dividing a difference between the ground voltage VSS and the supply voltage VDD when the PMOS transistor 11 is in the on-state. The first signal S1 is output from a first node n1 placed between the resistors 12 and 13.

As shown in FIG. 4, the POR circuit of the first embodiment further includes an edge generator 20. The edge generator 20 includes a resistor 21, an NMOS transistor (FET) 22, and an inverter 23. The resistor 21 and the NMOS transistor (FET) 22 are connected in series between the power supply line PL and the ground line GL. The inverter 23 is coupled to a second node n2 placed between the resistor 21 and the NMOS transistor 22. The gate of the NMOS transistor 22 is coupled to the first node n1 of the signal generator 10. The NMOS transistor 22 turns on when the voltage at the DPWD input port 31 becomes low and the voltage at the first node n1 exceeds the threshold voltage level of the NMOS transistor 22. When the voltage at the DPWD input port 31 becomes high and the voltage at the first node n1 falls, the NMOS transistor 22 turns off. A voltage of the second signal S2 is generated at the second node n2 between the resistor 21 and the NMOS transistor 22, by dividing the difference between the ground voltage VSS and the supply voltage VDD when the NMOS transistor 22 is in the on-state. The inverter 23 outputs a third signal (VWI signal) S3.

As shown in FIG. 4, the POR circuit of the first embodiment also includes a DPWD delay circuit 40. The DPWD delay circuit 40 is coupled to the DPWD input port 31 and outputs a fourth signal (DLDPWD signal) S4. The DLDPWD signal S4 is obtained by delaying a high-to-low transition of the DPWD signal applied to the DPWD input port 31. The DPWD delay circuit 40 includes four inverters 41 to 44 connected in series, an NMOS transistor 45, and an NMOS transistor 46. The NMOS transistor 45 is connected between a third node n3 disposed between the inverters 41 and 42 and the ground line GL. The NMOS transistor 46 is connected between a fourth node n4 disposed between the inverters 43 and 44 and the ground line GL.

The inverters 41 to 44 are CMOS inverters, for instance. The DPWD delay circuit 40 is configured so that charge time of the third node n3 and the fourth node n4 become long. This can be implemented by increasing the gate length of the PMOS transistors forming the CMOS inverters and therefore decreasing the ratio of the gate width to the gate length ((gate width)/(gate length)). The DPWD delay circuit 40 configured as described above can delay a high-to-low transition of the input signal by a comparatively large amount, hardly delaying a low-to-high transition of the input signal.

The POR circuit of the first embodiment further includes an NMOS transistor 51, as shown in FIG. 4. The NMOS transistor 51 functions as a charging circuit to speed up the charging of the first node n1 namely at restoration from the DPWD mode and thus speed up the restoration of the voltage of the first signal S1 at the first node n1. The NMOS transistor 51 is connected in parallel to the resistor 12 so that the first node n1 of the signal generator 10 can be charged. The DLDPWD signal S4 output from the DPWD delay circuit 40 is input to the gate of the NMOS transistor 51.

The POR circuit of the first embodiment further includes an output inhibit circuit 60, as shown in FIG. 4. The output inhibit circuit 60 includes a NOR circuit 61 and an inverter 62. The NOR circuit 61 receives a VWI signal S3 output from the inverter 23 of the edge generator 60 and the DLDPWD signal S4 output from the DPWD delay circuit 40. The output of the NOR circuit 61 is input to the inverter 62. As a result, the output inhibit circuit 60 functions as an OR circuit. The output inhibit circuit 60 passes the VWI signal S3 when the DLDPWD signal S4 is at low level. When the DLDPWD signal S4 is at high level, the output from the output inhibit circuit 60 is always held high.

Figure 5:
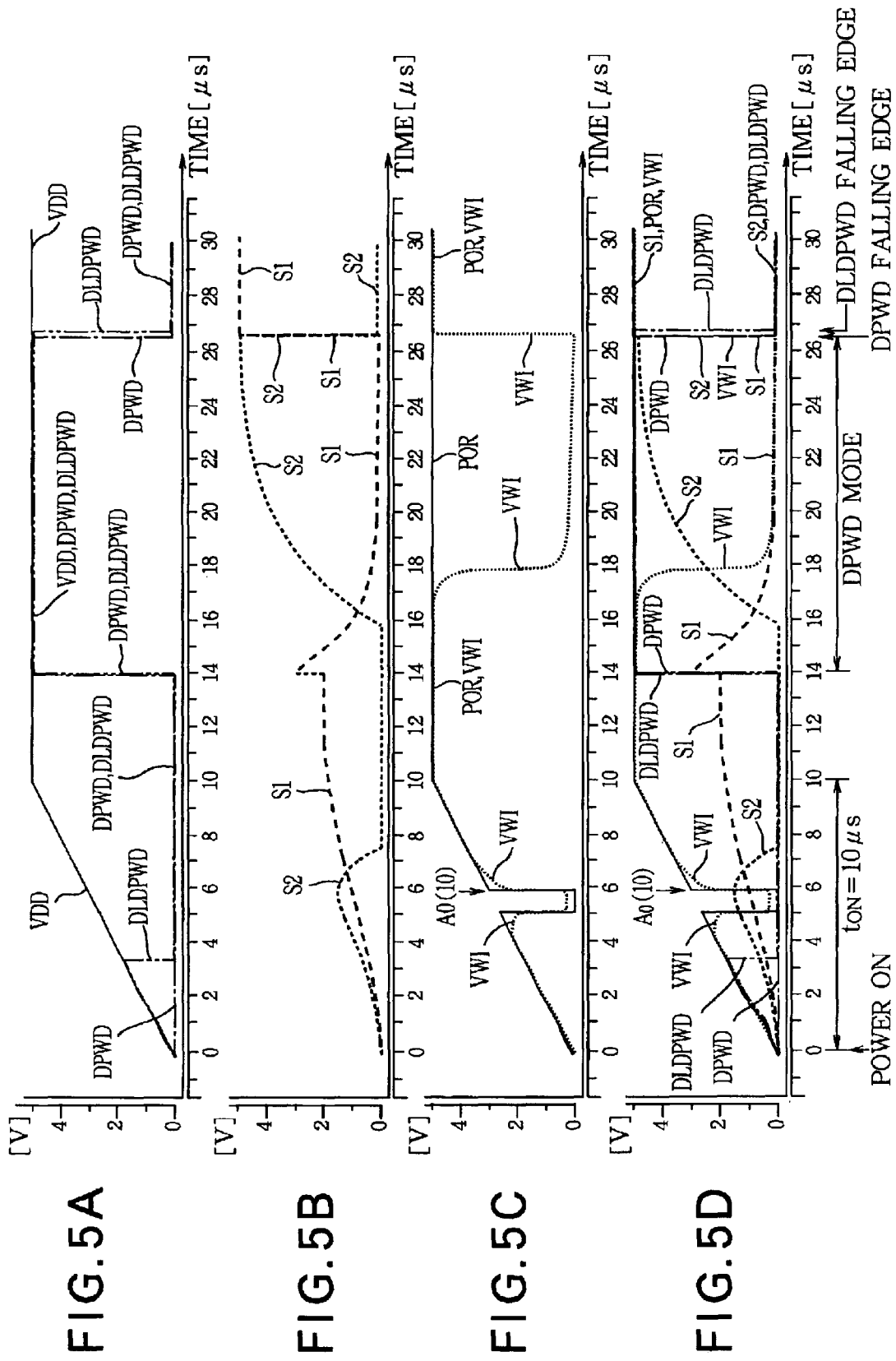
FIGS. 5A to 5D show simulated waveforms obtained from the POR circuit of the first embodiment when the power is turned on, with the voltage rise time of 10 $\mu$s, and at restoration from the DPWD mode.

The operation of the POR circuit of the first embodiment at restoration from the DPWD mode will next be described. The duration of the DPWD mode in the first embodiment is the period in which the DPWD signal applied to the DPWD input port 31 is held high. As shown in FIGS. 5A and 5D, when the DPWD signal goes high, the PMOS transistor 11 of the signal generator 10 turns off. The gate of the NMOS transistor 51 is supplied with the DLDPWD signal S4 obtained by delaying a high-to-low transition in the DPWD delay circuit 40, and the NMOS transistor 51 turns on. Therefore, the voltage of the first signal S1 at the first node n1 increases a little, and then gradually decreases as shown in FIGS. 5B and 5D (around a time point of 14 µs on the time axis). When the voltage of the first signal S1 at the first node n1 falls below the threshold level of the NMOS transistor 22, the NMOS transistor 22 turns off. Then, as shown in FIGS. 5B and 5D (around a period of 15.5 µs to 27 µs on the time axis), the source of the NMOS transistor 22 is charged with the supply voltage VDD, and the voltage of the second signal S2 at the second node n2 gradually increases.

At restoration from the DPWD mode, the DPWD signal applied to the DPWD input port 31 changes from high to low, as shown in FIGS. 5A and 5D (around a period of 26

μs to 27 μs on the time axis). When the DPWD signal goes low, the PMOS transistor 11 turns on, and the voltage of the first signal S1 at the first node n1 increases. Because the DLDPWD signal S4 goes low after the DPWD signal goes low, the NMOS transistor 51 turns off after the PMOS transistor 11 turns on. This means that both the NMOS transistor 51 and the PMOS transistor 11 are in the on-state for a certain period of time. With this operation of the NMOS transistor 51, the first node n1 is charged via the power supply line PL, the PMOS transistor 11, and the NMOS transistor 51, so that the voltage rise at the first node n1 becomes steeper than that in the above-described conventional art. Therefore, the voltage rise at the first node n1 causes the NMOS transistor 22 to turn on earlier. When the NMOS transistor 22 turns on, the second node n2 discharges. The voltage fall at the second node n2 causes the VWI signal S3 output from the inverter 23 to have an edge waveform.

On the other hand, the DLDPWD signal S4 output from the DPWD delay circuit 40 falls after the waveform of the VWI signal S3 falls down, as shown in FIGS. 5A and 5D (a period of 26 μs to 27 μs on the time axis). Because the output inhibit circuit 60 outputs an ORed result, the POR output does not fall but remains high. Accordingly, in the POR circuit of the first embodiment, the DPWD delay circuit 40 delays the falling edge of the DLDPWD signal S4 (around a time point of 26.7 μs on the time axis shown in FIGS. 5A and 5D), which is an input signal of the output inhibit circuit 60, and the DPWD delay circuit 40 and the NMOS transistor 51 advance the rising edge of the VWI signal S3 (around a time point of 26.6 μs on the time axis shown in FIGS. 5C and 5D), which is another input signal of the output inhibit circuit 60. Because at least one of the two input signals of the output inhibit circuit 60 is held high, the signal output from the output inhibit circuit 60 is held high. At restoration from the DPWD mode, the VWI signal S3 output from the inverter 23 includes an edge waveform, but the output from the POR output port 32 does not include an edge waveform (i.e., a reset signal), as has been described above.

The operation of the POR circuit of the first embodiment when the power is turned on will next be described. The power-on operation changes the supply voltage VDD from the power-off state (0 V, for instance) to the power-on-state (5 V, for instance). FIG. 5A shows an example in which the supply voltage VDD rises with the voltage rise time $t_{ON}$ of 10 μs when the power is turned on in the semiconductor integrated circuit (a period of 0 to 10 μs on the time axis). In the meantime, the DPWD signal is held low. While the supply voltage VDD is gradually increasing within the rise time $t_{ON}$, the first node n1 is charged through the PMOS transistor 11 and the resistor 12. As shown in FIGS. 5B and 5D, the voltage of the first signal S1 at the first node n1 gradually increases.

At the beginning of the power-on operation, the NMOS transistor 22 is in the off-state because the voltage of the first signal S1 at the first node n1 is 0 V. The source of the NMOS transistor 22 coupled through the resistor 21 to the supply voltage VDD is charged. As shown in FIGS. 5B and 5D, the voltage of the second signal S2 at the second node n2 gradually increase with increase in the supply voltage VDD.

When the voltage at the first node n1 exceeds the gate voltage (about 1 V) of the NMOS transistor 22, the NMOS transistor 22 turns on, and the charge flows from the source to the drain. The voltage of the second signal S2 at the second node n2 is discharged and lowers. On the other hand, the discharge at the second node n2 causes the VWI signal S3 output from the inverter 23 to fall abruptly (an edge at around a time point of 5 μs on the time axis shown in FIG. 5D) and then to rise immediately (an edge A0(10) at around a time point of 6 μs on the time axis shown in FIG. 5D). This abrupt low-to-high transition (i.e., an edge) in voltage is output as a reset signal from the POR output port 32.

Figure 6:
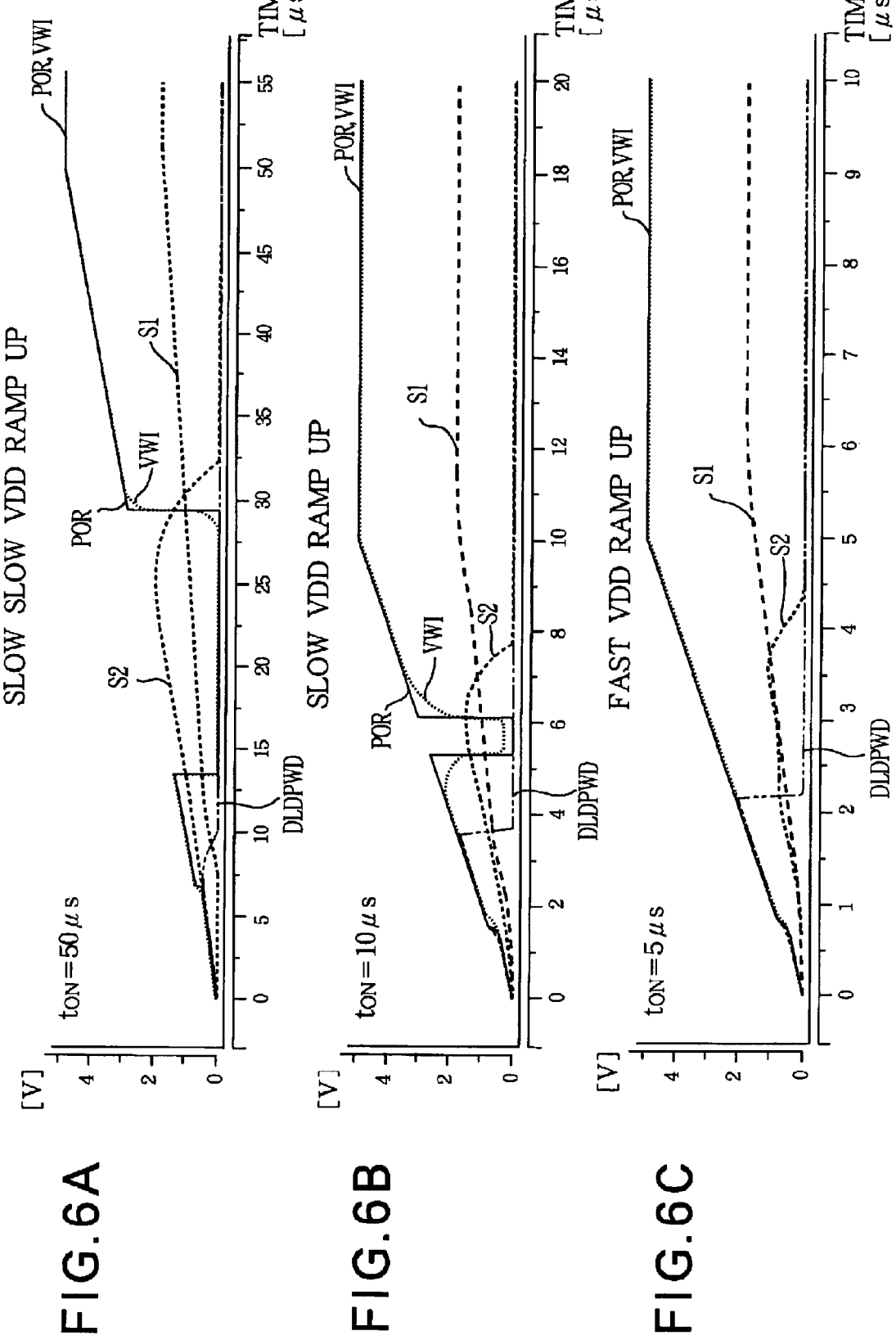
FIGS. 6A, 6B, and 6C show simulated waveforms obtained from the POR circuit of the first embodiment when the power is turned on, with the voltage rise time of 50 $\mu$s, 10 $\mu$s, and 5 $\mu$s, respectively.

FIGS. 6A, 6B, and 6C show simulated waveforms obtained from the POR circuit of the first embodiment when the power is turned on, with the voltage rise time $t_{ON}$ of 50 μs, 10 μs, and 5 μs, respectively. The results shown in FIGS. 6A, 6B, and 6C indicate that the POR circuit of the first embodiment cannot output a reset signal if the voltage rise time $t_{ON}$ when the power is turned on is as short as 5 μs, and a reset signal can be output from the POR output port 32 if the voltage rise time $t_{ON}$ when the power is turned on is at least 10 μs or more.

<Variation of First Embodiment>

Figure 7:
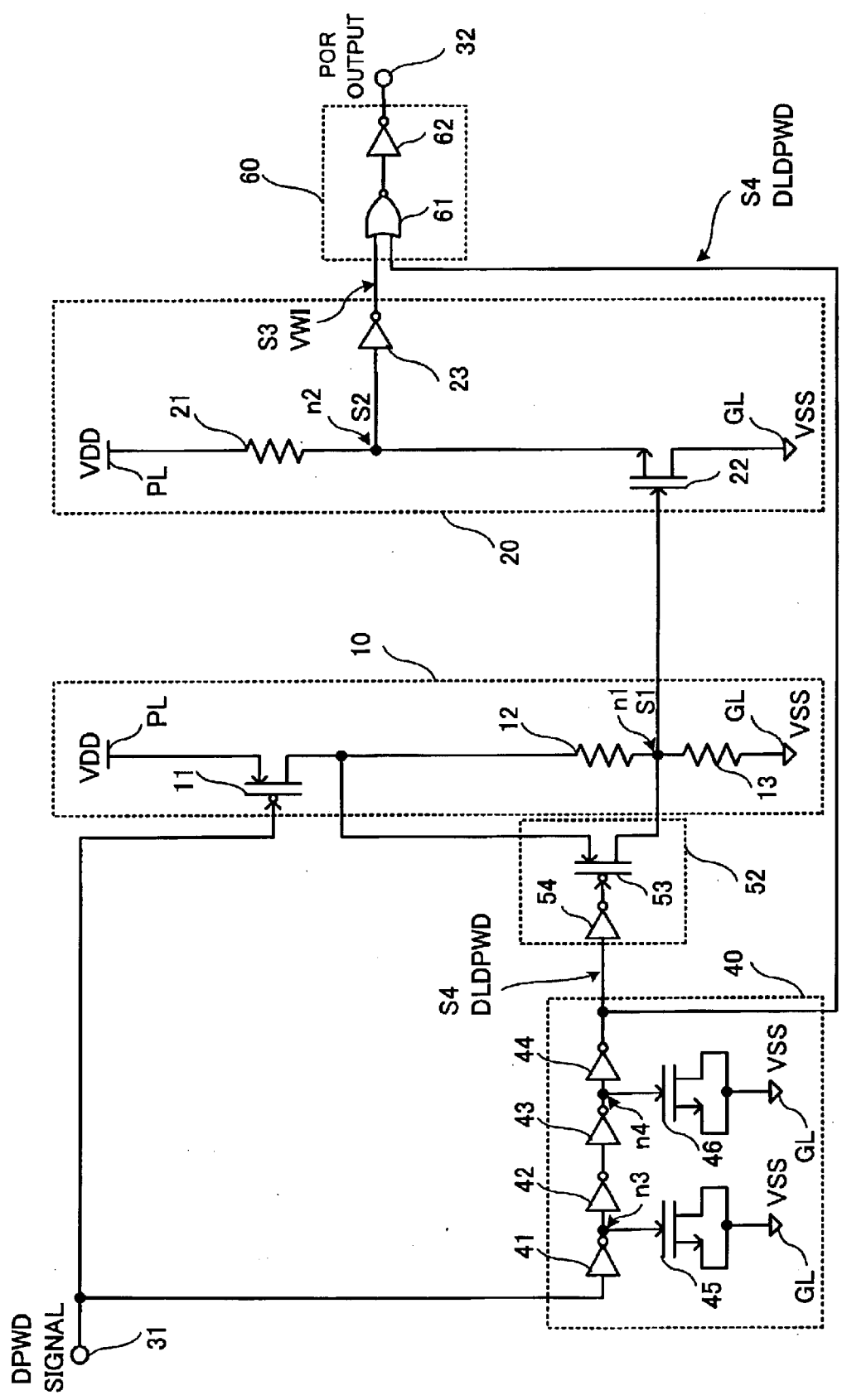
FIG. 7 is a circuit diagram showing a configuration of a variation of the POR circuit of the first embodiment.
Figure 8:
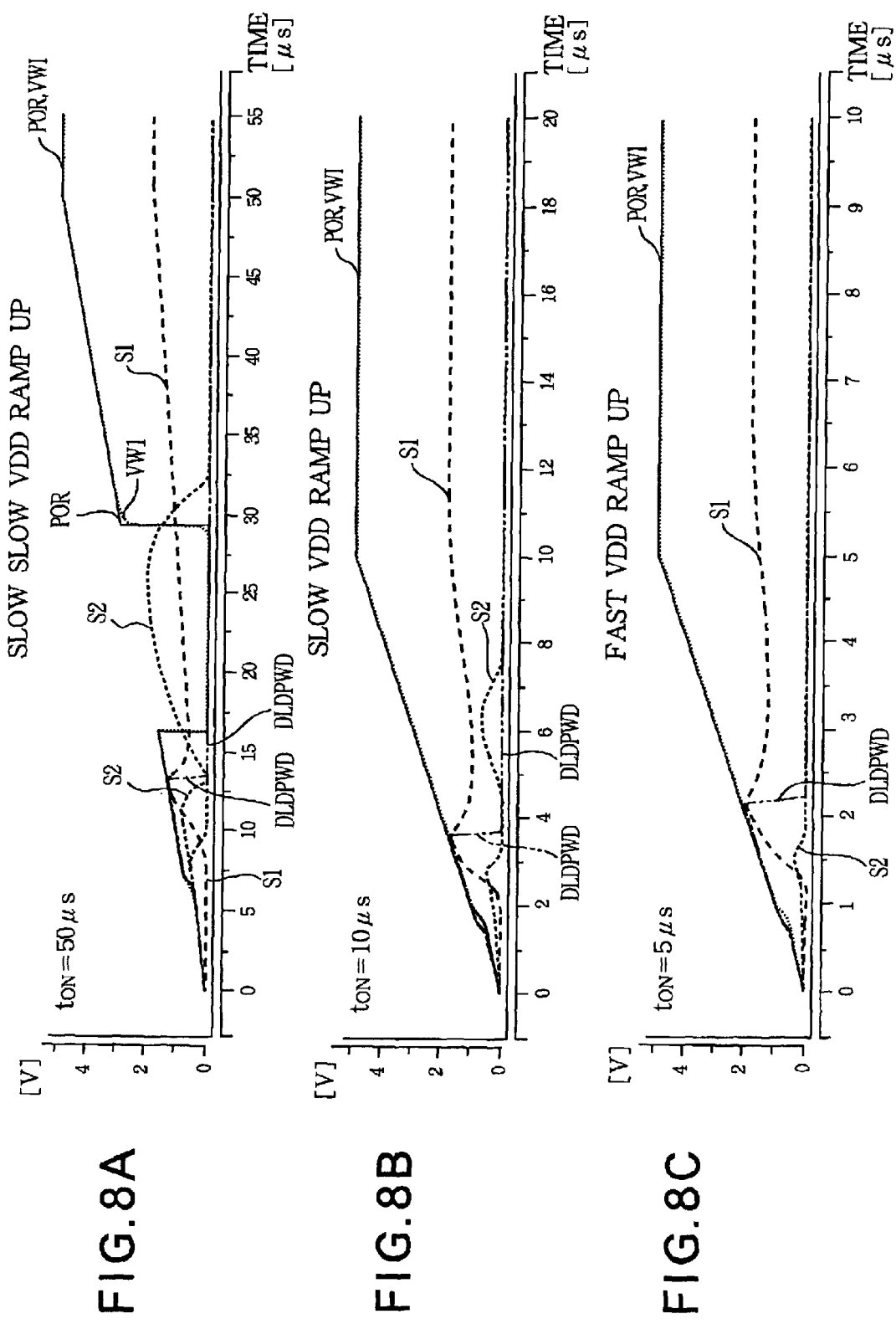
FIGS. 8A, 8B, and 8C show simulated waveforms obtained from the POR circuit of the variation shown in FIG. 7 when the power is turned on, with the voltage rise time of 50 $\mu$s, 10 $\mu$s, and 5 $\mu$s, respectively.

FIG. 7 is a circuit diagram showing a configuration of a variation of the POR circuit of the first embodiment. FIGS. 8A, 8B, and 8C show simulated waveforms obtained from the variation of the POR circuit of the first embodiment when the power is turned on, with the voltage rise time $t_{ON}$ of 50 μs, 10 μs, and 5 μs, respectively.

Figure 1:
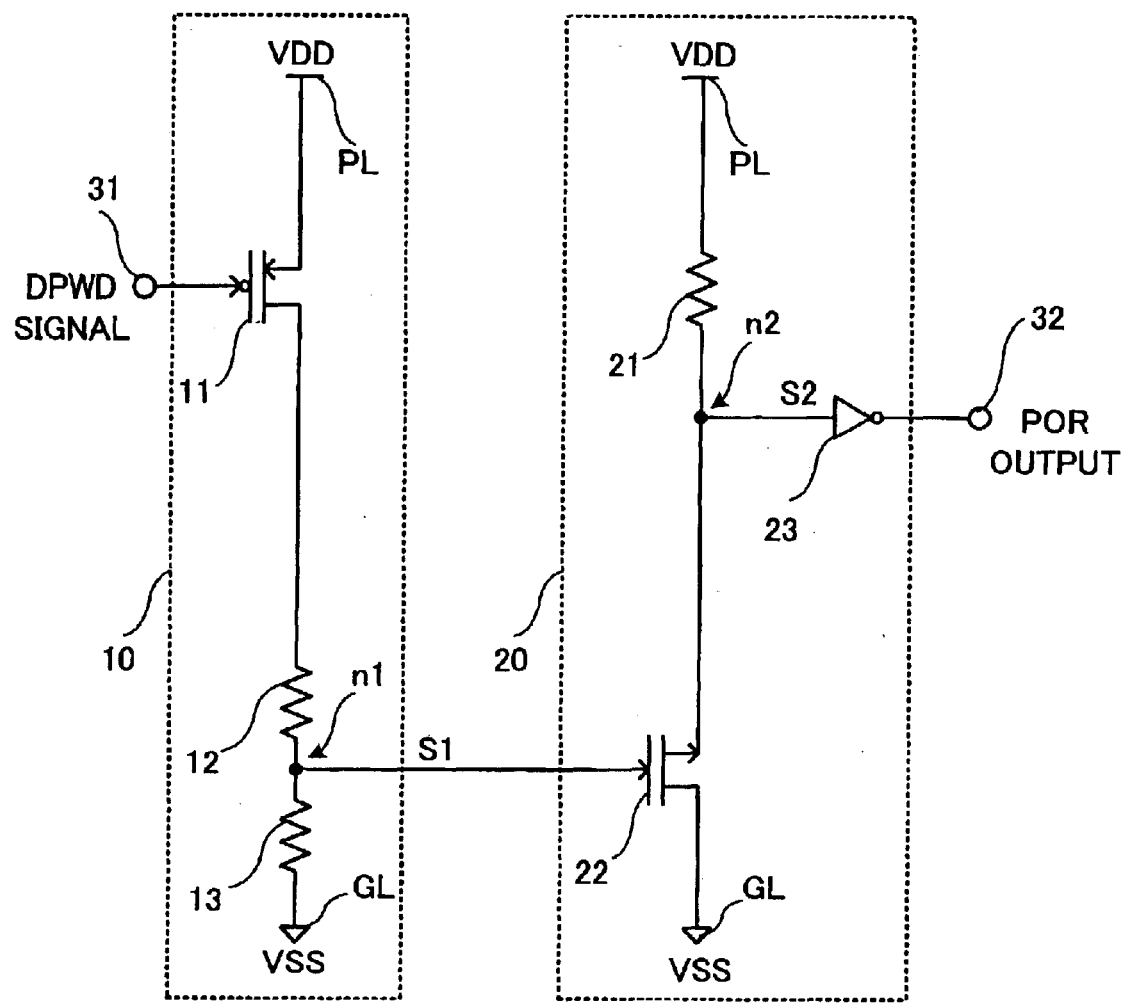
FIG. 1 is a circuit diagram showing a configuration of a conventional POR circuit.
Figure 2:
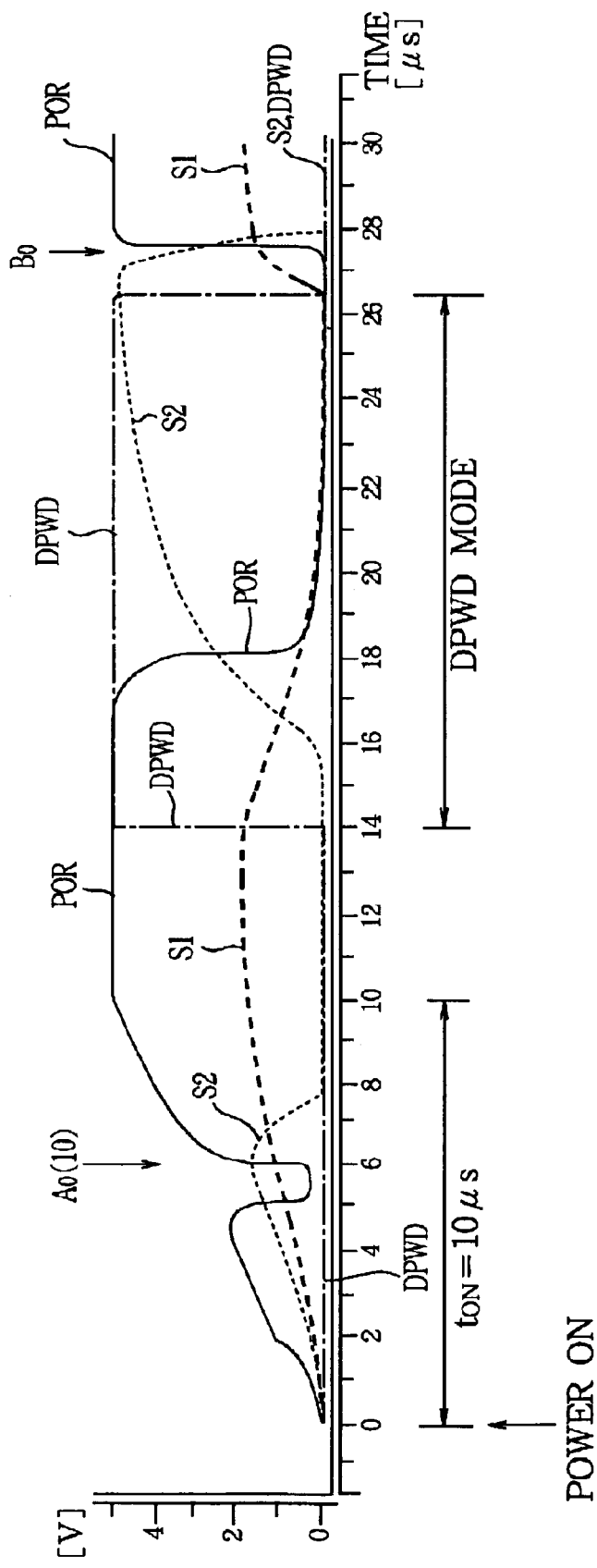
FIG. 2 shows simulated waveforms obtained from the conventional POR circuit when the power is turned on, with the voltage rise time of 10 µs, and at restoration from the DPWD mode.
Figure 3:
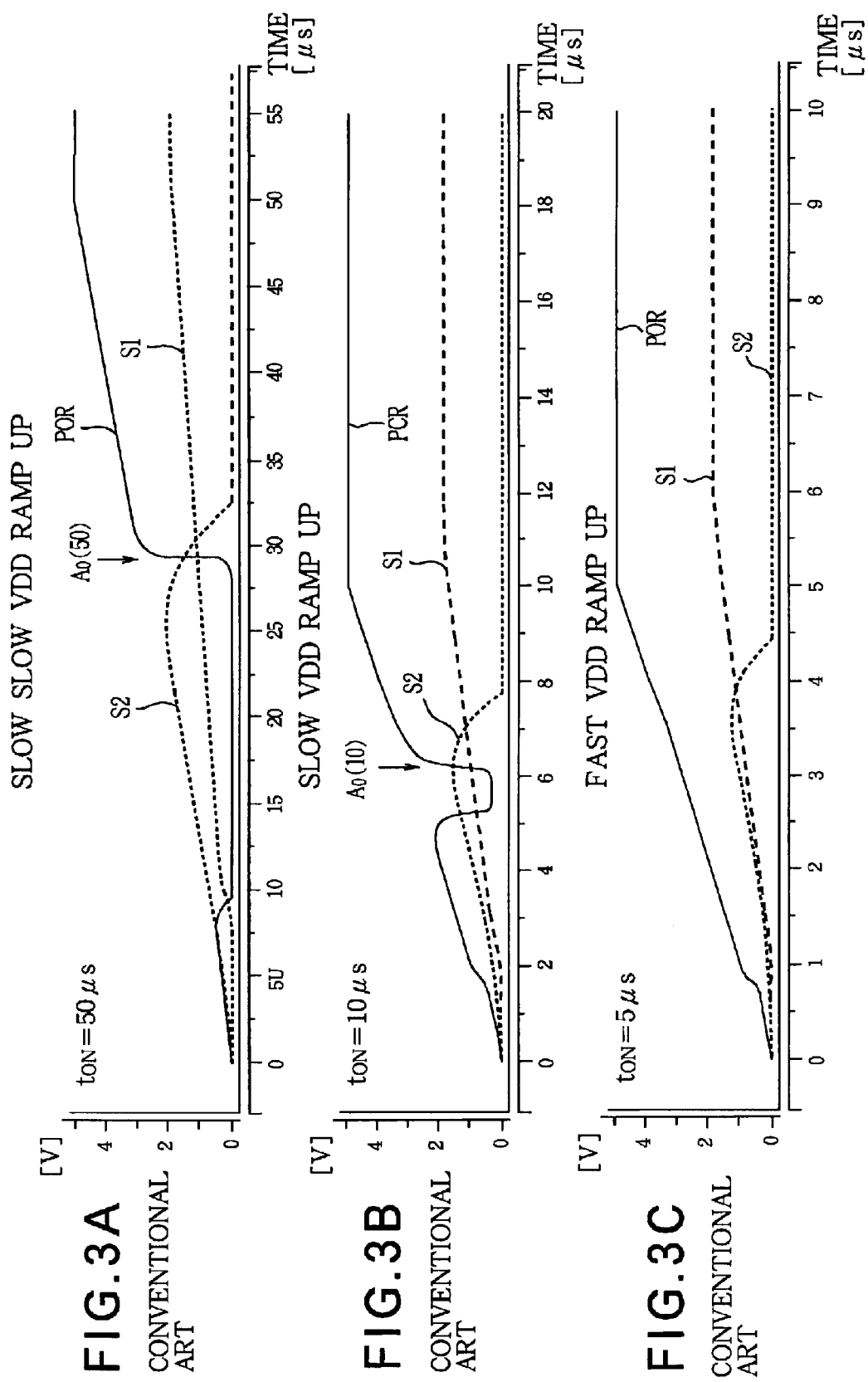
FIGS. 3A, 3B, and 3C show simulated waveforms obtained from the conventional POR circuit when the power is turned on, with the voltage rise time of 50 µs, 10 µs, and 5 µs, respectively.

The POR circuit as the variation of the first embodiment was examined while the POR circuit of the first embodiment was studied. In FIG. 7, elements that are the same as or correspond to those shown in FIG. 1 are indicated by the same reference characters. The POR circuit shown in FIG. 7 differs from the POR circuit of the first embodiment in that the elements provided to speed up the charge of the first node n1 are a PMOS transistor 53 and an inverter 54, instead of the NMOS transistor 51 used in the first embodiment.

Like the POR circuit of the first embodiment, the POR circuit shown in FIG. 7 can avoid the output of a reset signal at restoration from the DPWD mode, by means of the DPWD delay circuit 40, the PMOS transistor 53 and the inverter 54.

However, it was found that the PMOS transistor 53 added to improve the operation at restoration from the DPWD mode might adversely affect the operation when the power is turned on. The POR circuit shown in FIG. 7 can output a reset signal if the rise time $t_{ON}$ of the supply voltage VDD is about 50 μs, for instance, as shown in FIG. 8A. If the rise time $t_{ON}$ of the supply voltage VDD is reduced to about 10 μs, however, the POR circuit shown in FIG. 7 hardly outputs the reset signal, as shown in FIG. 8B. If the rise time $t_{ON}$ of the supply voltage VDD is about 10 μs, any rising of the voltage of the DLDPWD signal S4 immediately after power-on, as shown in FIG. 8B, directly causes the output of the inverter 54 to go low, changing the PMOS transistor 53 to the on-state. As a result, the NMOS transistor 22 turns on to start discharging the second node n2 before the voltage of the second signal S2 at the second node n2 sufficiently rises.

As has been described above, the POR circuit shown in FIG. 7 can avoid the output of the reset signal from the POR output port 32 at restoration from the DPWD mode. If the voltage rise time $t_{ON}$ when the power is turned on is short, the reset signal that has to be output when the power is turned on may not be output. The POR circuit of the first embodiment shown in FIG. 1, however, can output the reset signal at restoration from the DPWD mode. Further, the POR circuit of the first embodiment can output the reset signal even if the voltage rise time $t_{ON}$ when the power is turned on is short (10 μs, for instance).

<Second Embodiment>

Figure 9:
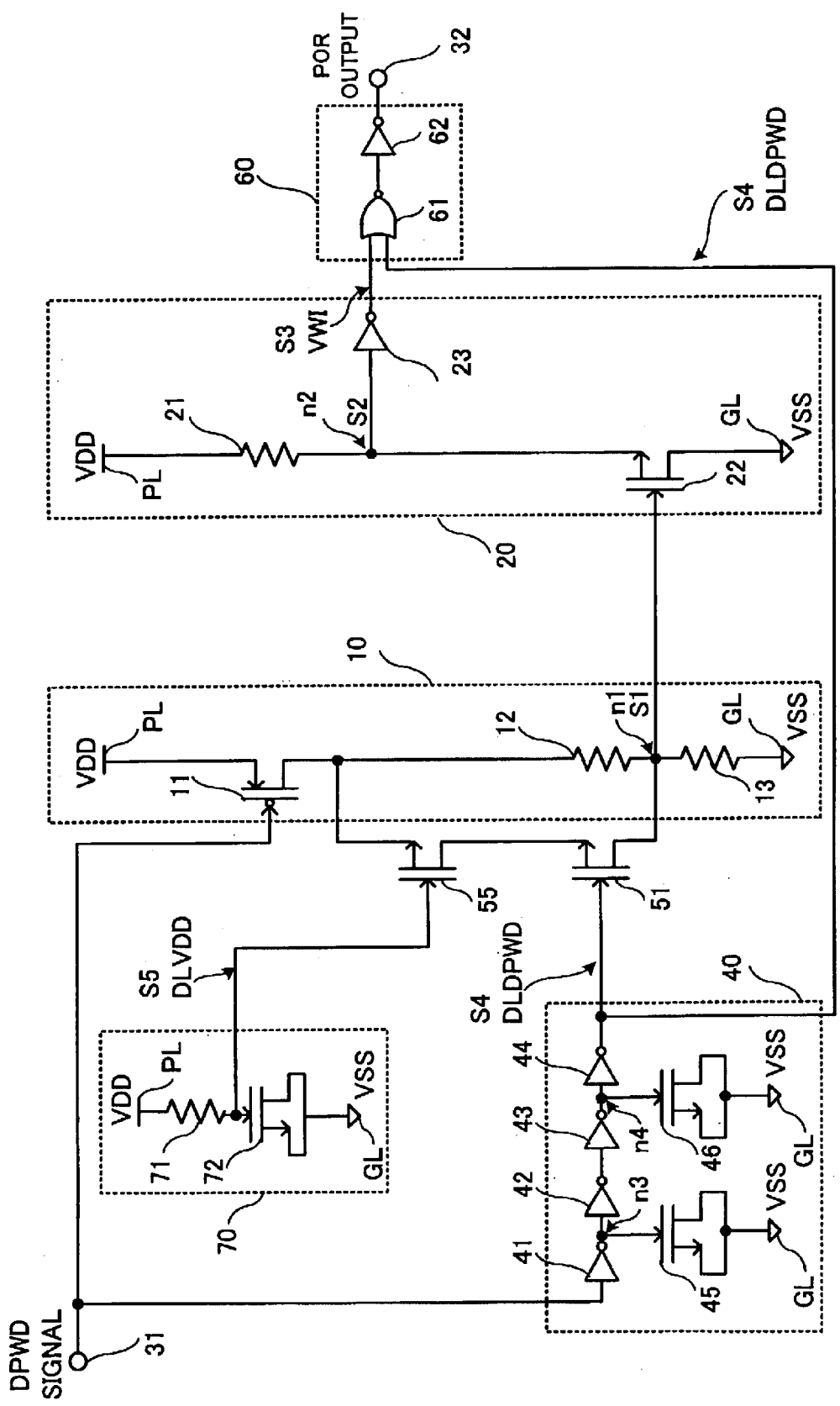
FIG. 9 is a circuit diagram showing a configuration of the POR circuit in accordance with the second embodiment of the present invention.
Figure 10:
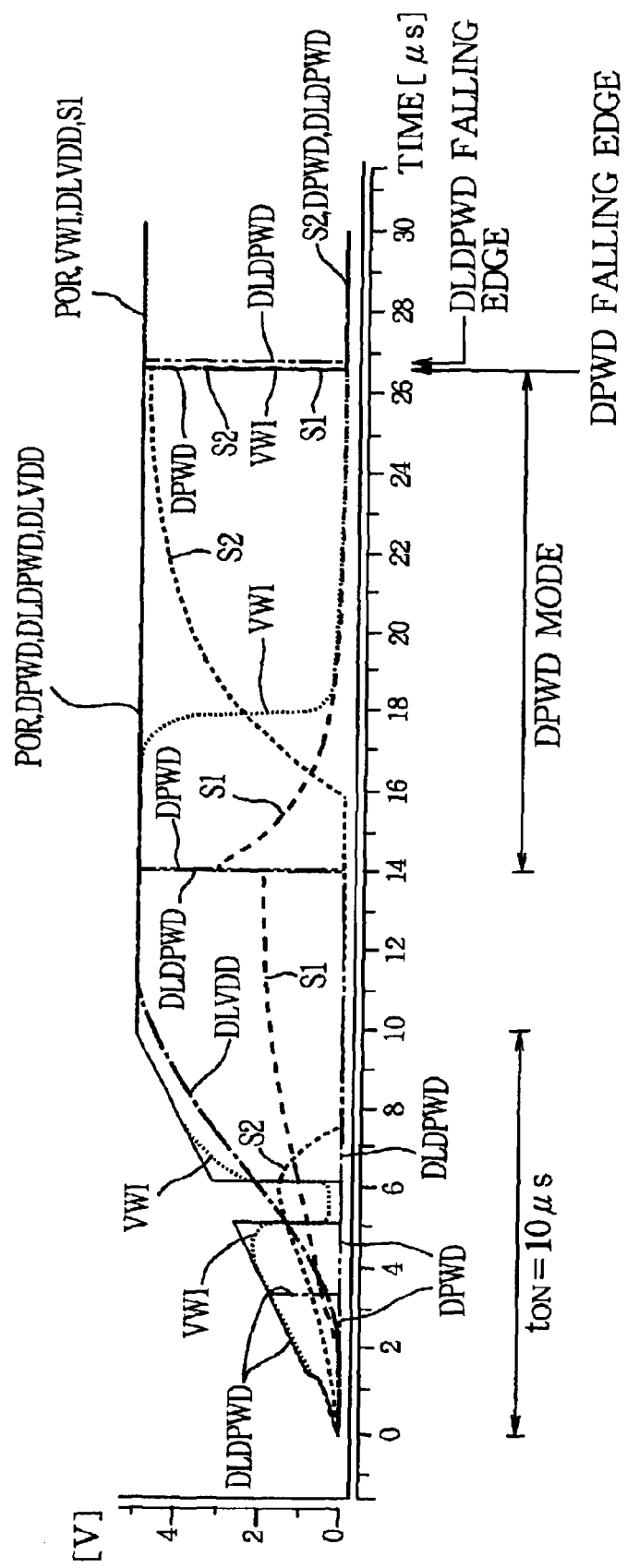
FIG. 10 shows simulated waveforms obtained from the POR circuit of the second embodiment when the power is turned on, with the voltage rise time of 10 $\mu$s, and at restoration from the DPWD mode.

FIG. 9 is a circuit diagram showing a configuration of a POR circuit in accordance with the second embodiment of the present invention. FIG. 10 shows simulated waveforms obtained from the POR circuit of the second embodiment when the power is turned on, with the voltage rise time $t_{ON}$ of 10 μs, and at restoration from the DPWD mode.

In FIG. 9, elements that are the same as or correspond to those shown in FIG. 1 are indicated by the same reference characters. The POR circuit of the second embodiment shown in FIG. 9 differs from the POR circuit of the first embodiment described earlier in that it further includes a VDD delay circuit 70 and an NMOS transistor 55. The VDD delay circuit 70 generates a fifth signal (DLVDD signal) S5 by delaying the waveform of the supply voltage VDD. The NMOS transistor 55 is connected in series with the NMOS transistor 51 and is controlled by the DLVDD signal S5.

The VDD delay circuit 70 includes a resistor 71 having one end coupled to the power supply line PL and an NMOS transistor 72 having a source and a drain coupled to the ground line GL and a gate coupled to another end of the resistor 71. The VDD delay circuit 70 may have a different configuration if it can output the waveform of the supply voltage VDD with a delay. The NMOS transistor 55 delays the timing at which the supply voltage VDD of the power supply line PL is applied to the NMOS transistor 51 when the supply voltage VDD changes from the power-off state to the power-on state. The NMOS transistor 55 may be replaced with a switching circuit of different configuration having the similar function.

The operation of the POR circuit of the second embodiment when the power is turned on will next be described. Because the VDD delay circuit 70 and the NMOS transistor 55 having a gate to receive the DLVDD signal S5 are added, even if the level of the DLDPWD signal S4 rises immediately after power-on, causing the NMOS transistor 51 to instantaneously turn on after power-on, the first node n1 is not charged. Accordingly, the NMOS transistor 22 of the edge generator 20 does not turn on unnecessarily, and the second node n2 can be reliably charged before the reset signal is generated. Therefore, the POR circuit of the second embodiment can reliably generate the reset signal.

The operation of the POR circuit of the second embodiment at restoration from the DPWD mode will next be described. After the supply voltage VDD rises, the NMOS transistor 55 in the POR circuit of the second embodiment is in the on-state. Therefore, after the supply voltage VDD rises, the operation of the POR circuit of the second embodiment is the same as the operation of the POR circuit of the first embodiment. Like the POR circuit of the first embodiment, the POR circuit of the second embodiment can avoid the output of the reset signal at restoration from the DPWD mode, by means of the DPWD delay circuit 40, the NMOS transistor 51, and the output inhibit circuit 60.

Figure 11A:
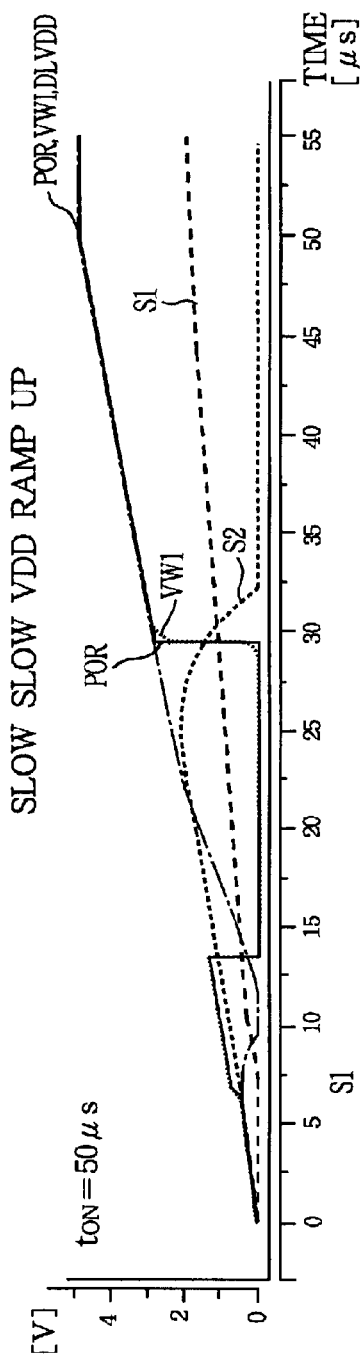
FIGS. 11A, 11B, and 11C show simulated waveforms obtained from the POR circuit of the second embodiment when the power is turned on, with the voltage rise time of 50 $\mu$s, 10 $\mu$s, and 5 $\mu$s, respectively.
Figure 11B:
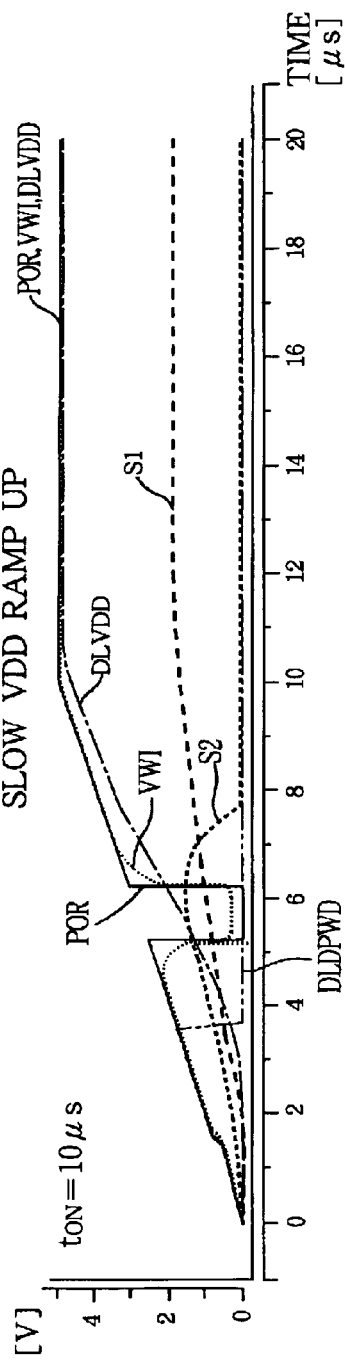
Figure 11C:
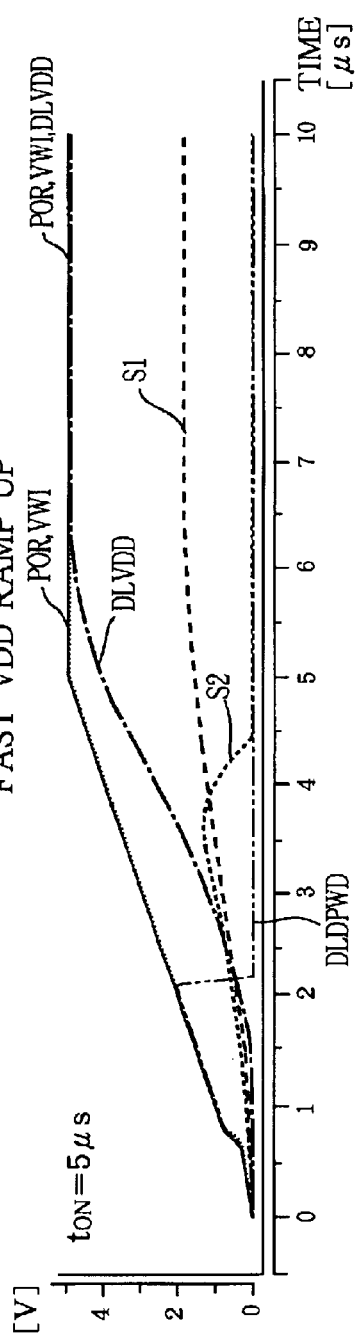

FIGS. 11A, 11B, and 11C show simulated waveforms obtained from the POR circuit of the second embodiment when the power is turned on, with the voltage rise time $t_{ON}$ of 50 μs, 10 μs, and 5 μs, respectively. The results shown in FIGS. 11A, 11B, and 11C indicate that the POR circuit of the second embodiment cannot output the reset signal if the voltage rise time $t_{ON}$ when the power is turned on becomes as short as 5 μs, and the reset signal can be output from the POR output port 32 if the voltage rise time $t_{ON}$ when the power is turned on is at least 10 μs or more.

Except for the points described above, the second embodiment is the same as the first embodiment described earlier.

<Third Embodiment>

Figure 12:
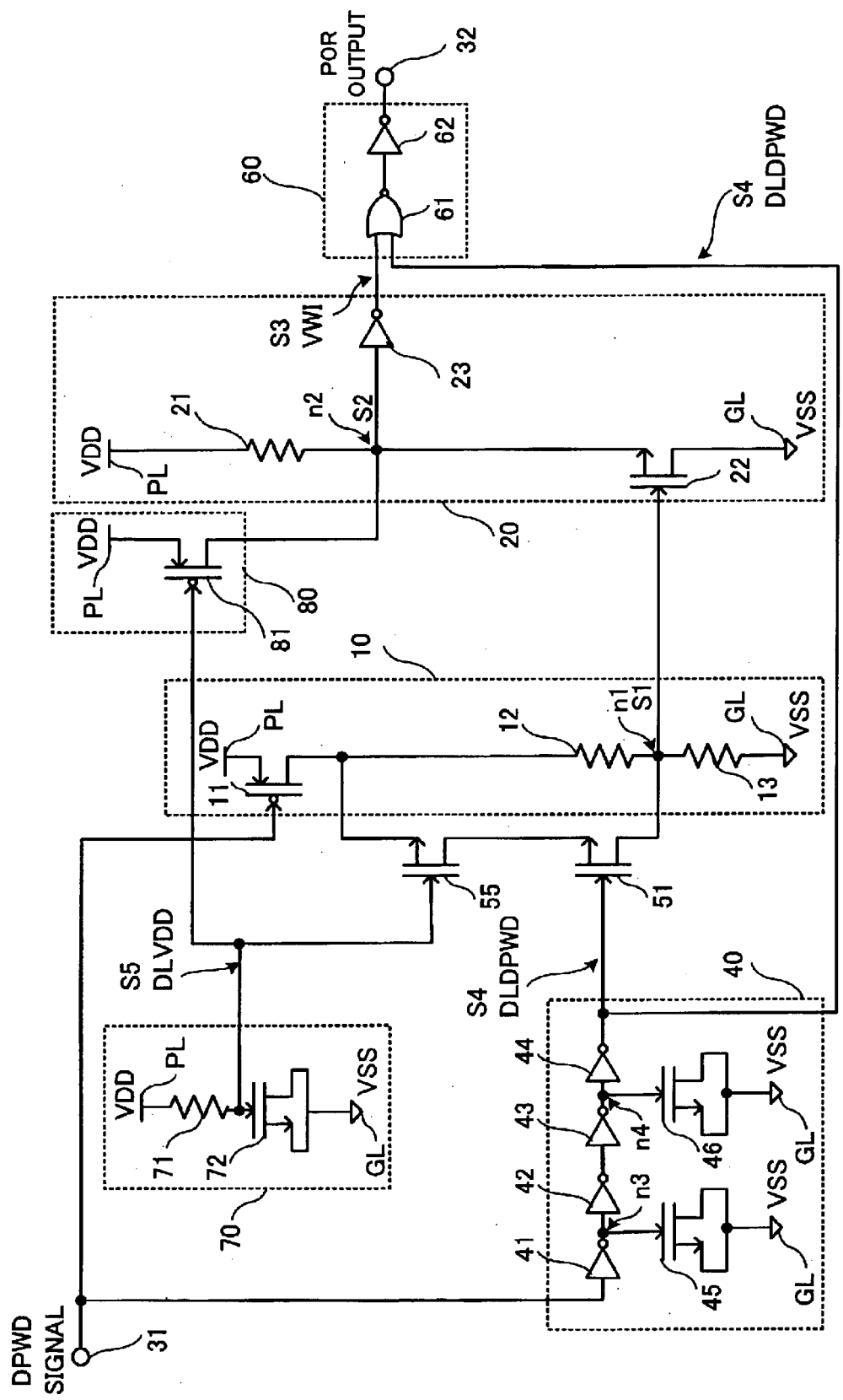
FIG. 12 is a circuit diagram showing a configuration of a POR circuit in accordance with the third embodiment of the present invention.
Figure 13:
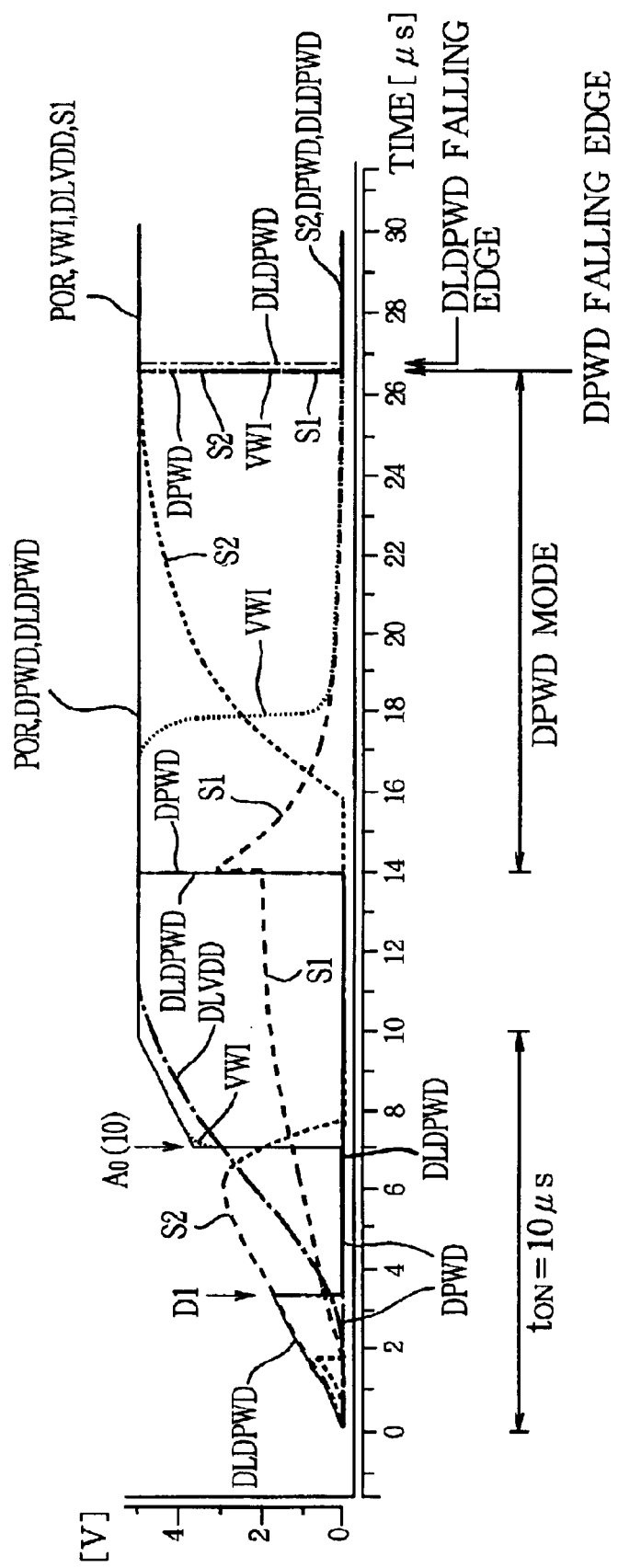
FIG. 13 shows simulated waveforms obtained from the POR circuit of the third embodiment when the power is turned on, with the voltage rise time of 10 $\mu$s, and at restoration from the DPWD mode.

FIG. 12 is a circuit diagram showing a configuration of a POR circuit in accordance with the third embodiment of the present invention. FIG. 13 shows simulated waveforms obtained from the POR circuit of the third embodiment when the power is turned on, with the voltage rise time $t_{ON}$ of 10 μs, and at restoration from the DPWD mode.

In FIG. 12, elements that are the same as or correspond to those shown in FIG. 9 are indicated by the same reference characters. The POR circuit of the third embodiment shown in FIG. 12 differs from the POR circuit of the second embodiment described earlier in that the switching circuit 80 is connected between the power supply line PL and the second node n2. When the device including the POR circuit changes its state from the power-off state to the power-on state, the switching circuit 80 charges the second node n2 until the voltage of the DLVDD signal S5 reaches a prescribed level. In this embodiment, the switching circuit 80 is a PMOS transistor 81 having a gate to receive the DLVDD signal S5. The switching circuit 80 may be another circuit element having the similar switching function.

The operation of the POR circuit of the third embodiment when the power is turned on will next be described. In the edge generator 20, the voltage of the second signal S2 at the second node n2 increases with increase in the supply voltage VDD. Then, when the NMOS transistor 22 turns on, the voltage of the second signal S2 at the second node n2 falls. The inverter 23 inverts an edge waveform (the second signal S2) sensed at the second node n2 and outputs the VWI signal S3. Accordingly, when the power is turned on, the voltage at the second node n2 has to be sufficiently raised before the NMOS transistor 22 turns on. In the first and second embodiments described earlier, the second node n2 is charged just with the current flowing through the resistor 21. In the third embodiment, however, when the power-off state changes to the power-on state, the switching circuit 80 also charges the second node n2 until the voltage of the DLVDD signal S5 reaches a prescribed level. As a result of the speeding up of the charging of the second node n2, the occurrence of the falling edge D1 shown in FIG. 13 can be advanced. Therefore, the POR circuit of the third embodiment can reliably output the reset signal even if the voltage rise time $t_{ON}$ when the power is turned on is short.

Figure 14A:
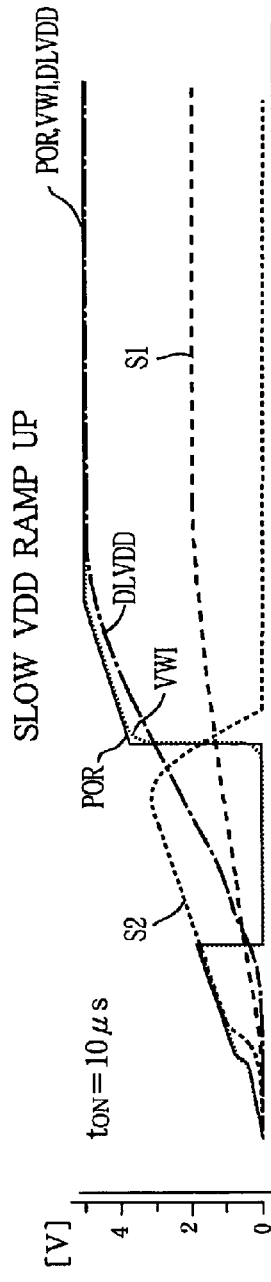
FIGS. 14A, 14B, and 14C show simulated waveforms obtained from the POR circuit of the third embodiment when the power is turned on, with the voltage rise time of 10 $\mu$s, 5 $\mu$s, and 1 $\mu$s, respectively.
Figure 14B:
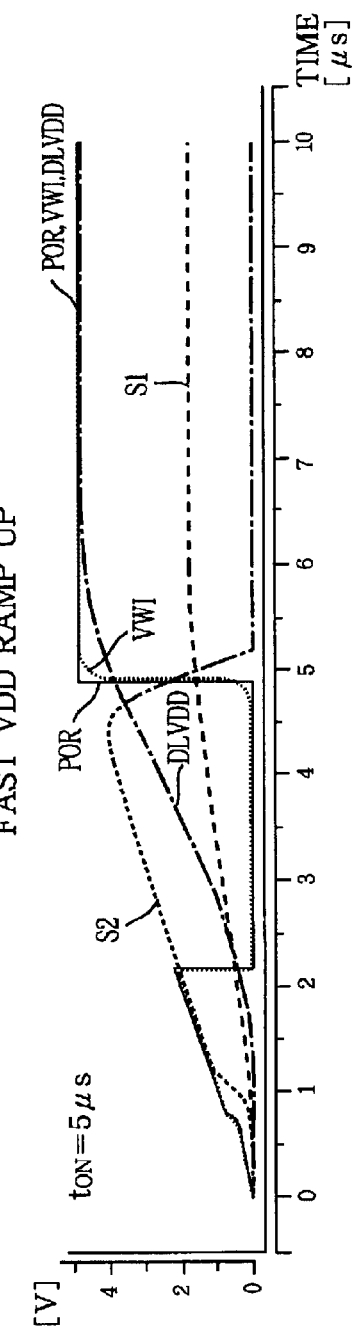
Figure 14C:
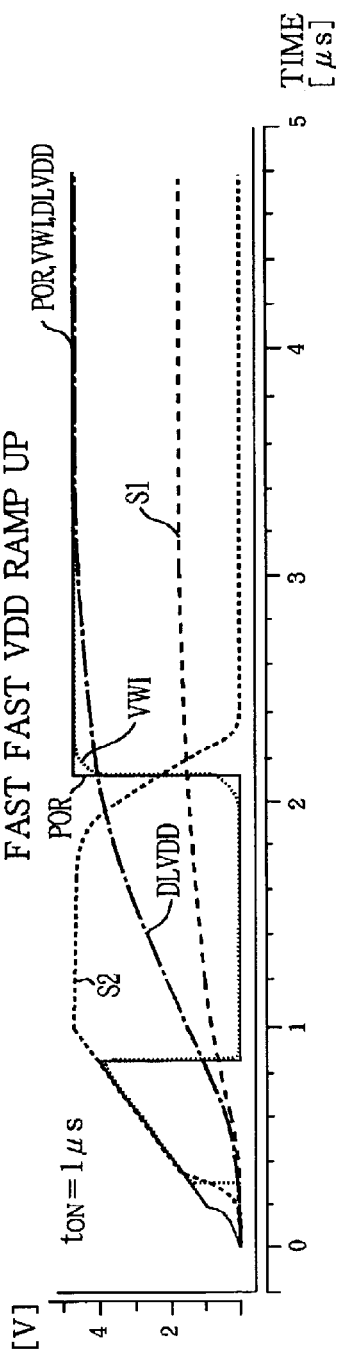

FIGS. 14A, 14B, and 14C show simulated waveforms obtained from the POR circuit of the third embodiment when the power is turned on, with the voltage rise time $t_{ON}$ of 10 μs, 5 μs, and 1 μs, respectively. The results shown in FIGS. 14A, 14B, and 14C indicate that the POR circuit of the third embodiment can output the reset signal from the POR output port 32 if the voltage rise time $t_{ON}$ when the power is turned on is at least 1 μs or more.

Except for the points described above, the third embodiment is the same as the first and second embodiments described earlier.

Figure 15:
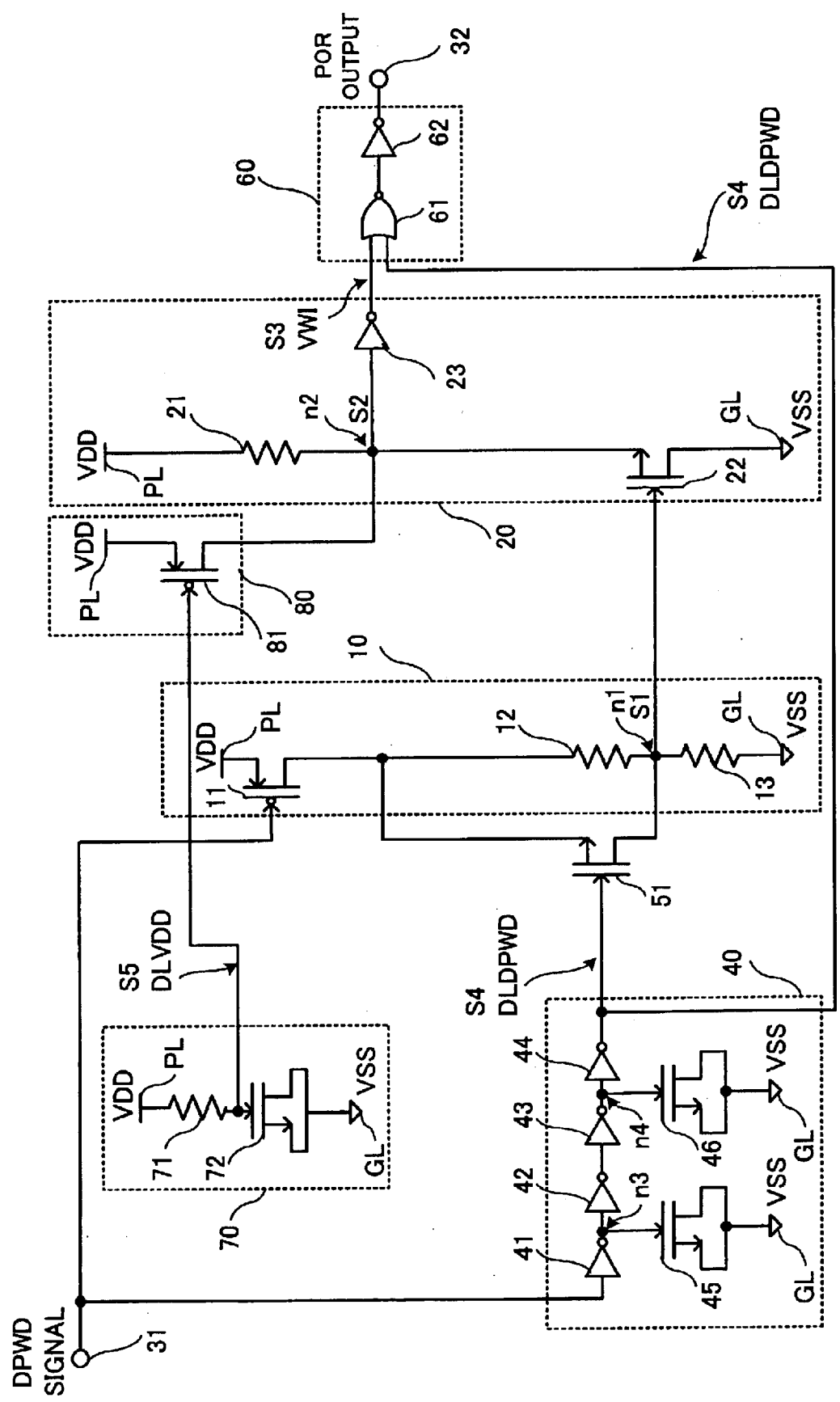
FIG. 15 is a circuit diagram showing a configuration of a variation of the POR circuit of the third embodiment of the present invention.

FIG. 15 is a circuit diagram showing a configuration of a variation of the POR circuit of the third embodiment. As shown in FIG. 15, the switching circuit 80 of the third embodiment may be applied to a POR circuit without the NMOS transistor 55. If the semiconductor integrated circuit allows the reset signal to be output at restoration from the DPWD mode, the elements 40, 51, and 60 shown in FIG. 15, which are provided to suppress the output of the reset signal at restoration from the DPWD mode, may be deleted.

<Fourth Embodiment>

Figure 16:
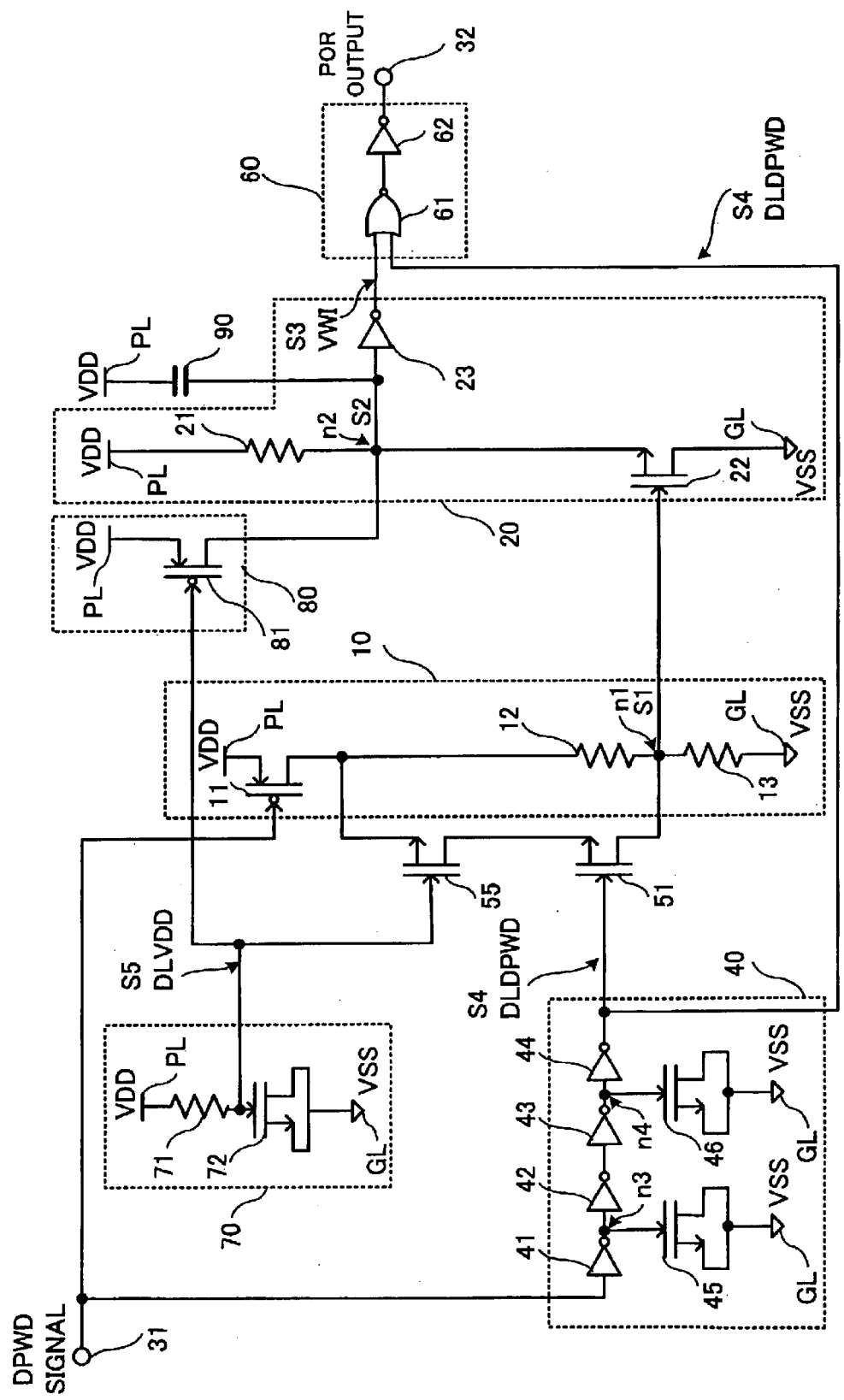
FIG. 16 is a circuit diagram showing a configuration of the POR circuit in accordance with the fourth embodiment of the present invention.
Figure 17:
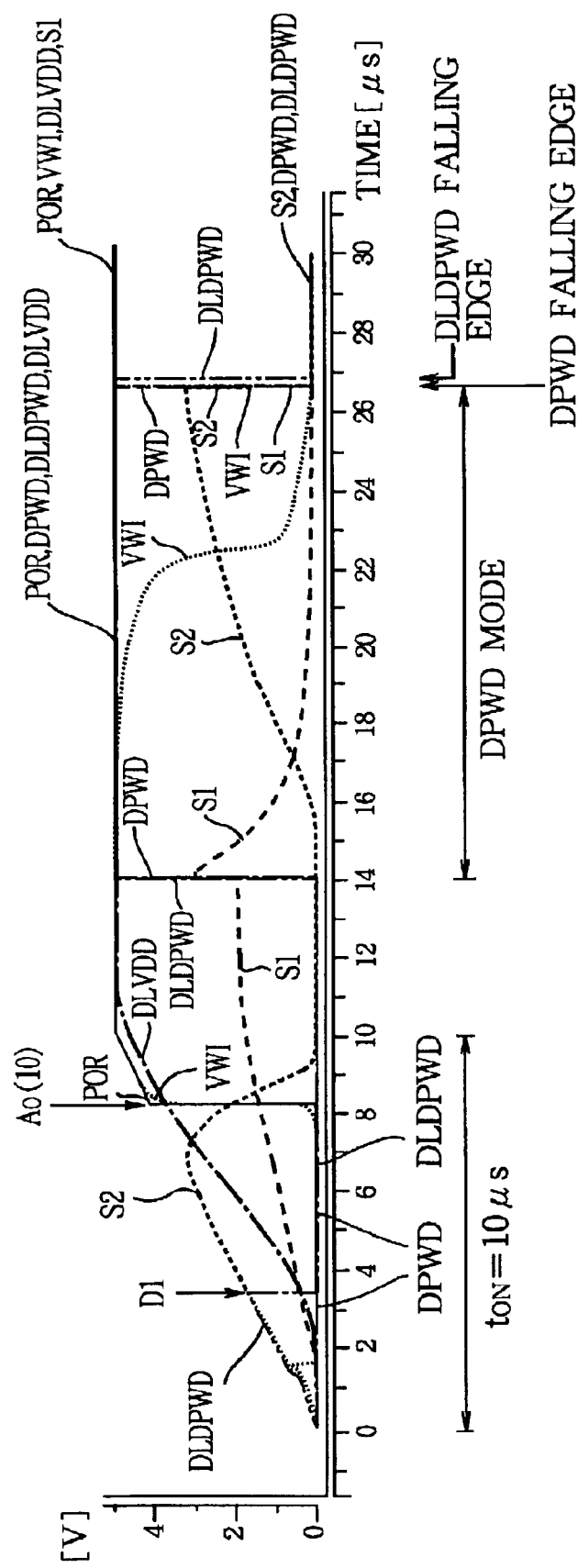
FIG. 17 shows simulated waveforms obtained from the POR circuit of the fourth embodiment when the power is turned on, with the voltage rise time of 10 $\mu$s, and at restoration from the DPWD mode.

FIG. 16 is a circuit diagram showing a configuration of a POR circuit in accordance with the fourth embodiment of the present invention. FIG. 17 shows simulated waveforms obtained from the POR circuit of the fourth embodiment when the power is turned on, with the voltage rise time $t_{ON}$ of 10 μs, and at restoration from the DPWD mode.

In FIG. 16, elements that are the same as or correspond to those shown in FIG. 12 are indicated by the same reference characters. The POR circuit of the fourth embodiment shown in FIG. 16 differs from the POR circuit of the third embodiment described earlier in that the capacitor 90 is coupled between the power supply line PL and the second node n2.

The operation of the POR circuit of the fourth embodiment when the power is turned on will next be described. In the edge generator 20, the voltage of the second signal S2 at the second node n2 increases with increase in the supply voltage VDD. Then, when the NMOS transistor 22 turns on, the voltage of the second signal S2 at the second node n2 decreases. The inverter 23 inverts an edge waveform (the second signal S2) sensed at the second node n2 and outputs the VWI signal S3. Accordingly, when the power is turned on, the voltage of the second signal S2 at the second node n2 has to be sufficiently raised before the NMOS transistor 22 turns on. In the fourth embodiment, when the device including the POR circuit changes its state from the power-off state to the power-on state, the second node n2 is charged with the current flowing through the resistor 21 and with the current flowing through the PMOS transistor 81 and also by means of the capacitor 90. As a result of the speeding up of the charging of the second node n2, the occurrence of the falling edge D1 shown in FIG. 17 can be advanced. Therefore, the POR circuit of the fourth embodiment can reliably output the reset signal even if the voltage rise time $t_{ON}$ when the power is turned on is short.

FIGS. 18A, 18B, and 18C show simulated waveforms obtained from the POR circuit of the fourth embodiment when the power is turned on, with the voltage rise time $t_{ON}$ of 10 μs, 5 μs, and 1 μs, respectively. The results shown in FIGS. 18A, 18B, and 18C indicate that the POR circuit of the fourth embodiment can output the reset signal from the POR output port 32 if the voltage rise time $t_{ON}$ when the power is turned on is at least 1 μs or more.

Except for the points described above, the fourth embodiment is the same as the first, second, and third embodiments described earlier.

The fourth embodiment described above was implemented by adding the capacitor 90 to the third embodiment. However, the capacitor 90 may be added to the first or second embodiment.

<Fifth Embodiment>

Figure 19:
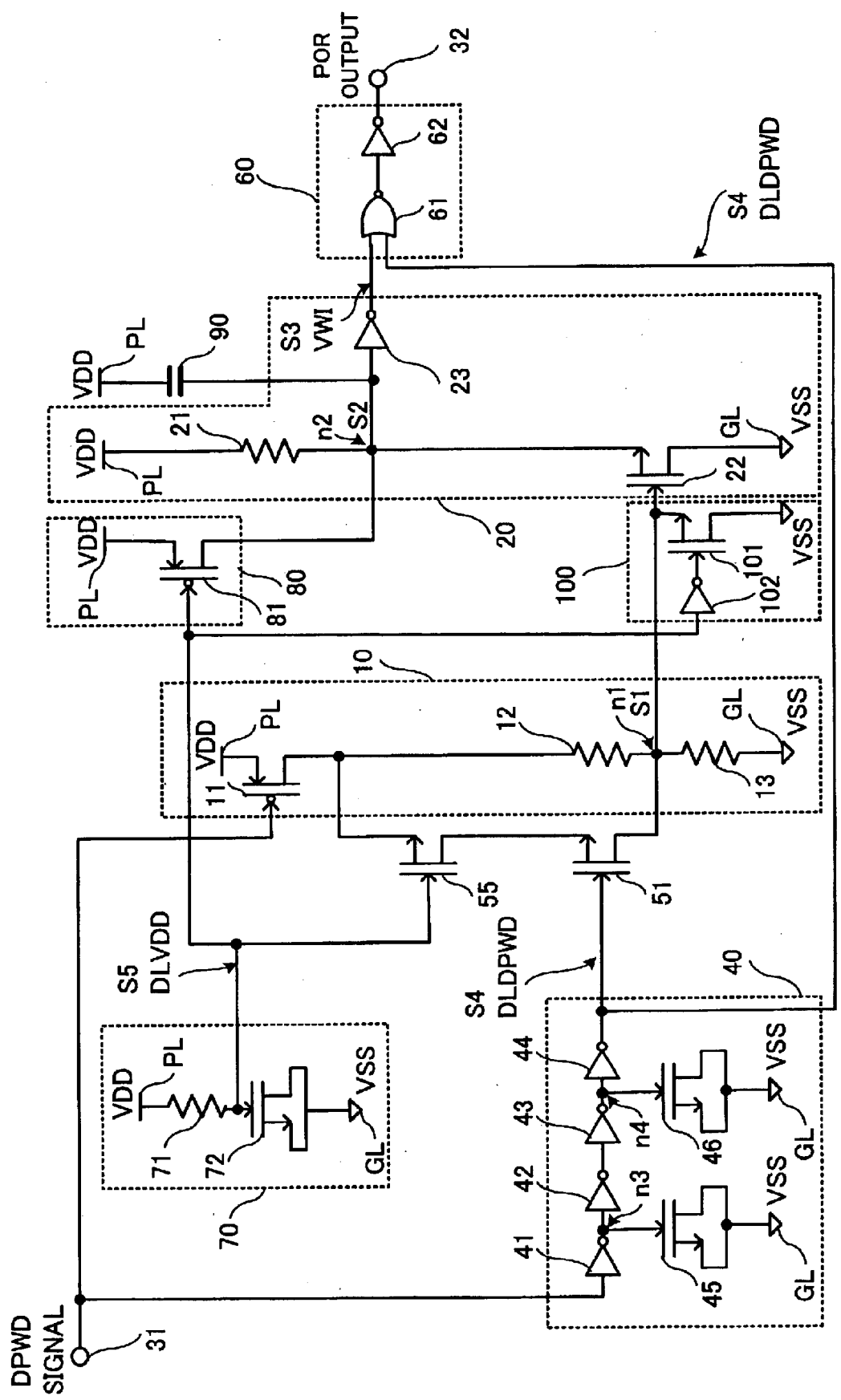
FIG. 19 is a circuit diagram showing a configuration of a POR circuit in accordance with the fifth embodiment of the present invention.
Figure 20:
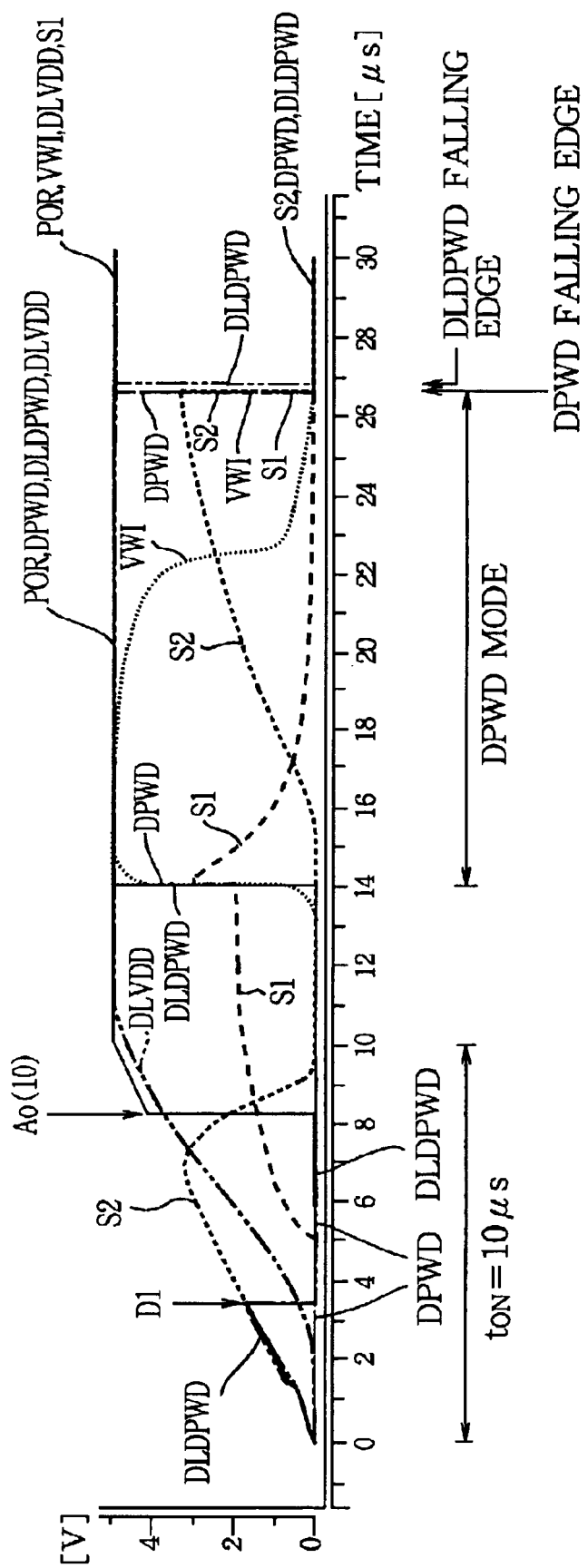
FIG. 20 shows simulated waveforms obtained from the POR circuit of the fifth embodiment when the power is turned on, with the voltage rise time of 10 $\mu$s, and at restoration from the DPWD mode.

FIG. 19 is a circuit diagram showing a configuration of a POR circuit in accordance with the fifth embodiment of the present invention. FIG. 20 shows simulated waveforms obtained from the POR circuit of the fifth embodiment when the power is turned on, with the voltage rise time $t_{ON}$ of 10 μs, and at restoration from the DPWD mode.

In FIG. 19, elements that are the same as or correspond to those shown in FIG. 16 are indicated by the same reference characters. The POR circuit of the fifth embodiment shown in FIG. 19 differs from the POR circuit of the fourth embodiment described earlier in that the switching circuit 100 is coupled between the first node n1 and the ground line GL. The switching circuit 100 discharges the first node n1 until the voltage of the DLVDD signal S5 reaches a prescribed level when the device including the POR circuit changes its state from the power-off state to the power-on state. In this embodiment, the switching circuit 100 includes the NMOS transistor 101 and the inverter 102. The NMOS transistor 101 is coupled between the first node n1 and the ground line VSS. The inverter 102 inputs a reversal of the DLVDD signal S5 to the gate of the NMOS transistor 101. The switching circuit 100 may be another circuit element having the similar switching function.

The operation of the POR circuit of the fifth embodiment when the power is turned on will next be described. In the edge generator 20, the voltage of the second signal S2 at the second node n2 increases with increase in supply voltage VDD. Then, when the NMOS transistor 22 turns on, the voltage of the second signal S2 at the second node n2 decreases. The inverter 23 inverts an edge waveform (the second signal S2) sensed at the second node n2 and outputs the VWI signal S3. Accordingly, when the power is turned on, the NMOS transistor 22 should turn on after the voltage of the second signal S2 at the second node n2 sufficiently increases. In the third and fourth embodiments described earlier, when the device including the POR circuit changes its state from the power-off state to the power-on state, the power-on reset signal is reliably generated by advancing the occurrence of the falling edge D1 through shortening the period until the voltage of the DLVDD signal S5 reaches a prescribed level. The fifth embodiment is configured to raise the voltage of the signal S2 at the second node n2 sufficiently, by disposing the switching circuit 100 to delay the turning on of the NMOS transistor 22. Therefore, the POR circuit of the fifth embodiment can raise the VWI signal S3 to a high voltage level and then the VWI signal S3 falls even if the voltage rise time $t_{ON}$ when the power is turned on in the semiconductor integrated circuit is short, and can reliably output the reset signal.

Figure 21:
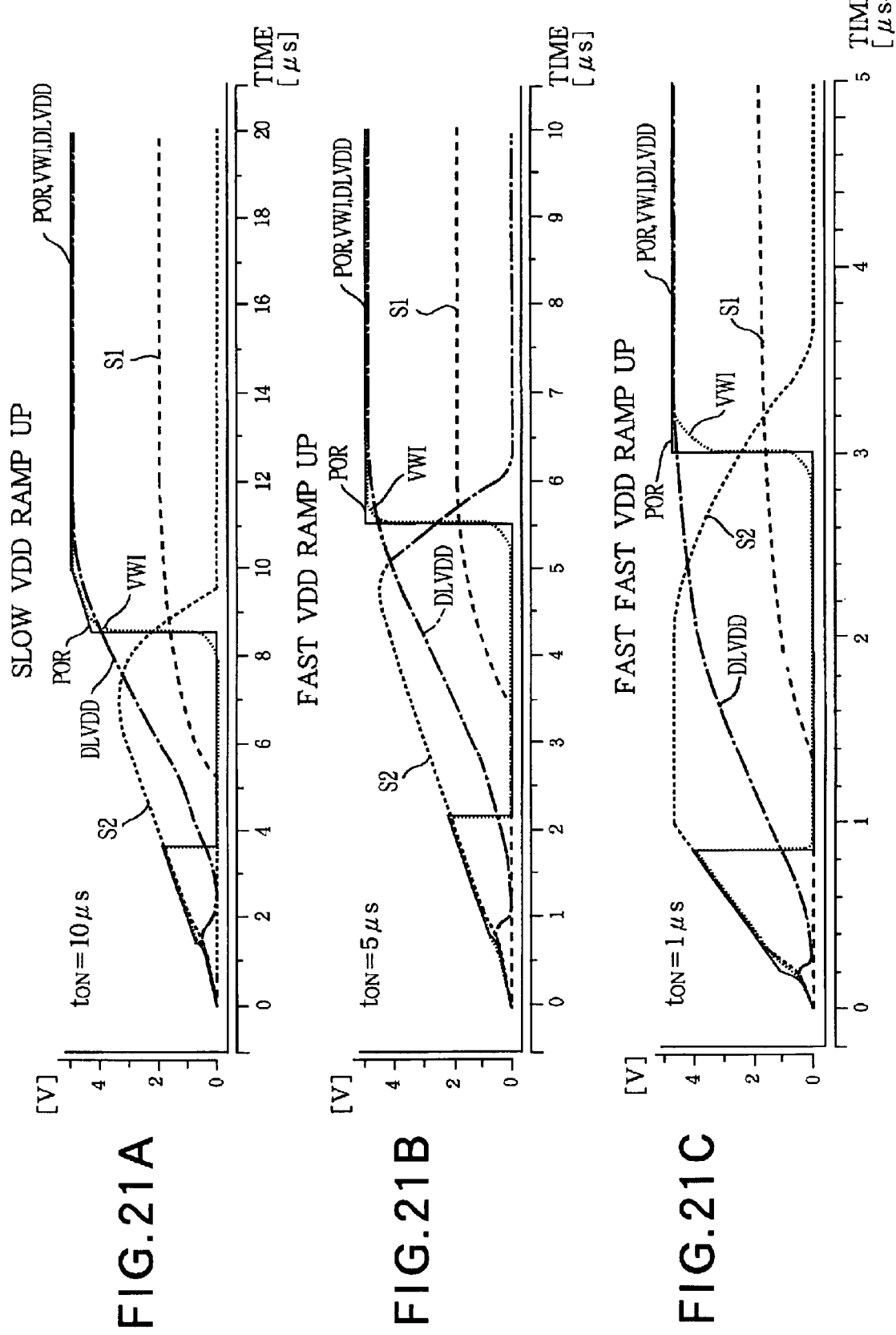
FIGS. 21A, 21B, and 21C show simulated waveforms obtained from the POR circuit of the fifth embodiment when the power is turned on, with the voltage rise time of 10 $\mu$s, 5 $\mu$s, and 1 $\mu$s, respectively.

FIGS. 21A, 21B, and 21C show simulated waveforms obtained from the POR circuit of the fifth embodiment when the power is turned on, with the voltage rise time of 10 μs, 5 μs, and 1 μs, respectively. The results shown in FIGS. 21A, 21B, and 21C indicate that the POR circuit of the fifth embodiment can output a reset signal from the POR output port 32 if the voltage rise time $t_{ON}$ when the power is turned on is at least 1 μs or more.

Except for the points described above, the fifth embodiment is the same as the first to fourth embodiments described earlier.

Figure 22:
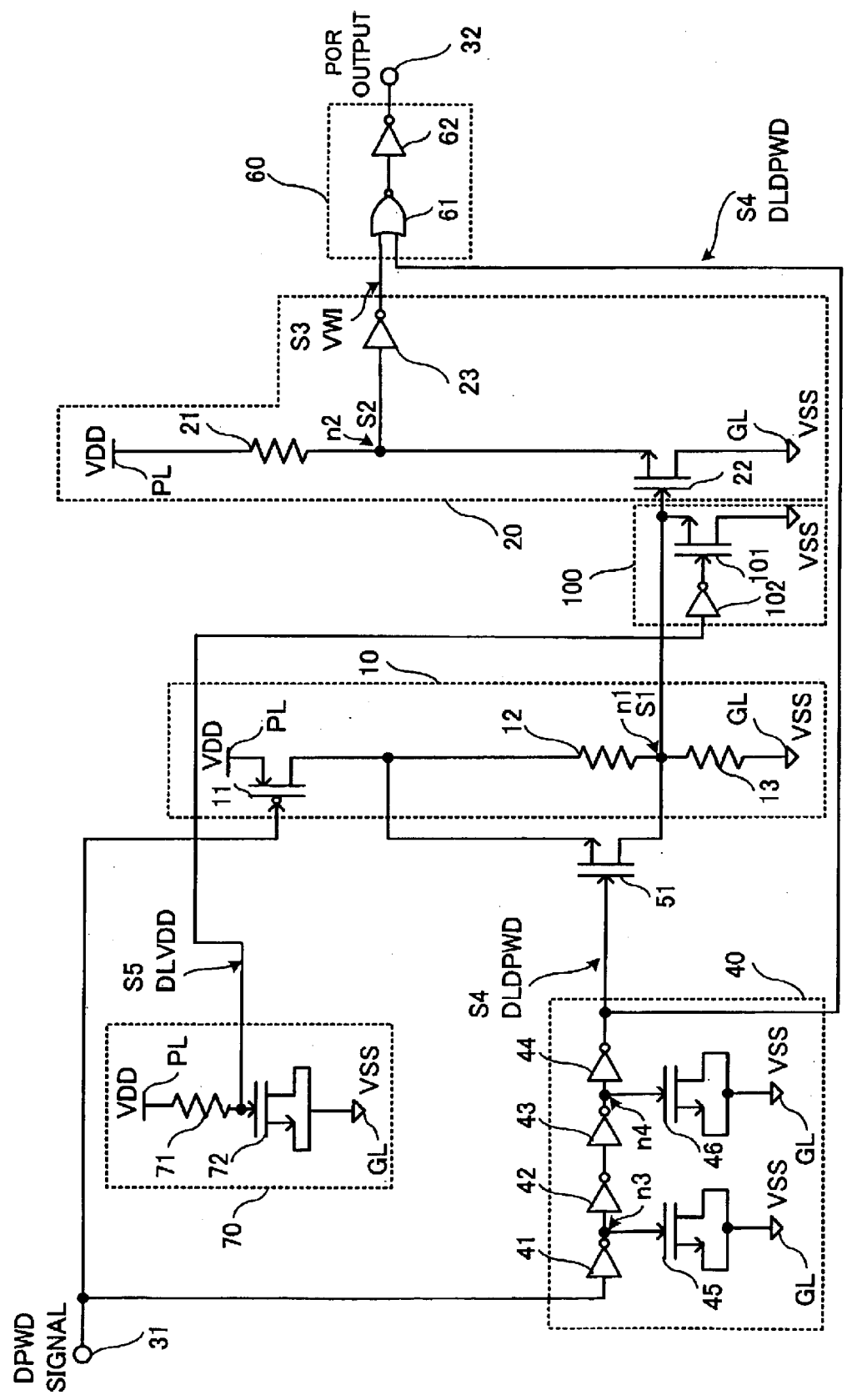
FIG. 22 is a circuit diagram showing a configuration of a variation of the POR circuit of the fifth embodiment.

FIG. 22 is a circuit diagram showing a configuration of a variation of the POR circuit of the fifth embodiment. As shown in FIG. 22, the switching circuit 100 of the fifth embodiment may be applied to the first embodiment. The switching circuit 100 of the fifth embodiment may also be applied to the second or third embodiment. If the semiconductor integrated circuit allows a reset signal to be output at restoration from the DPWD mode, the elements 40, 51, and 60 shown in FIG. 22, which are provided to avoid the output of the reset signal at restoration from the DPWD mode, may be deleted.

<Sixth Embodiment>

Figure 23:
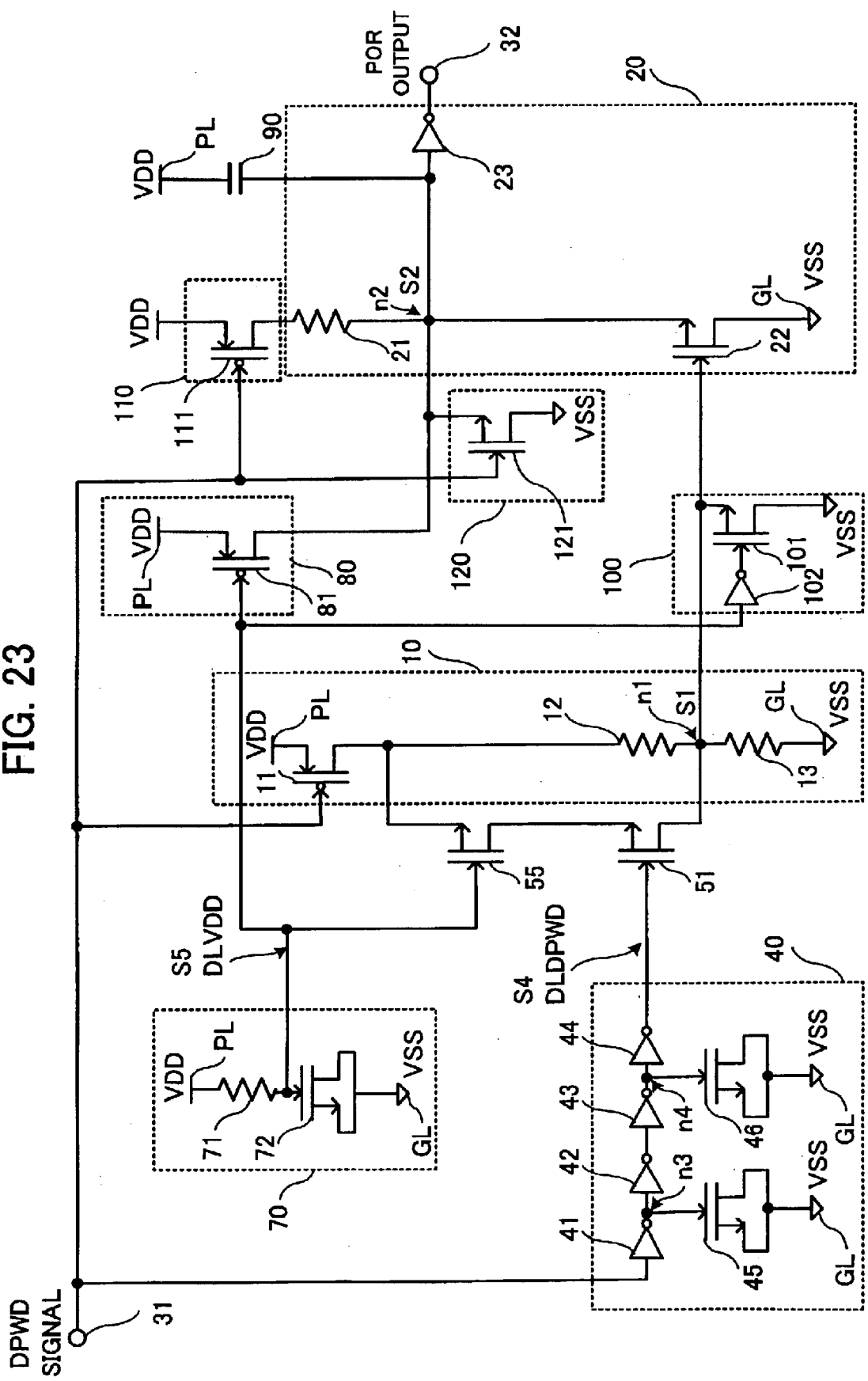
FIG. 23 is a circuit diagram showing a configuration of a POR circuit in accordance with the sixth embodiment of the present invention.
Figure 24:
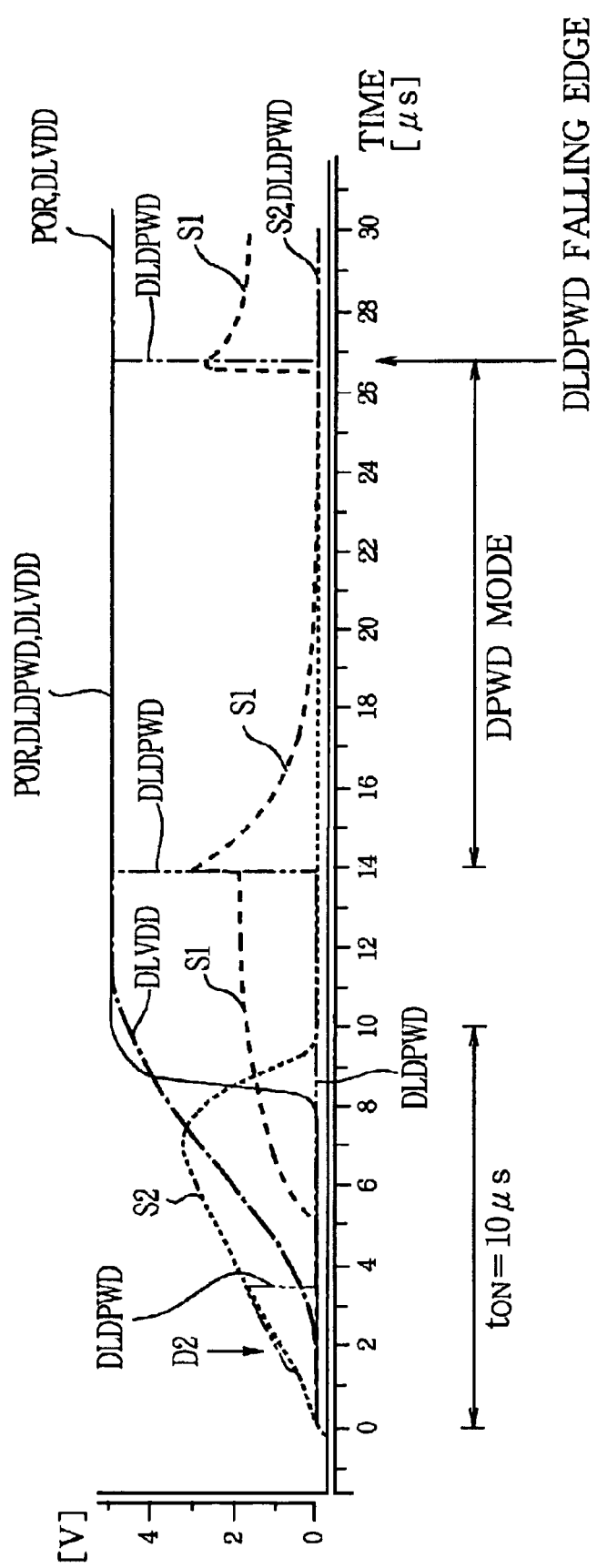
FIG. 24 shows simulated waveforms obtained from the POR circuit of the sixth embodiment when the power is turned on, with the voltage rise time of 10 $\mu$s, and at restoration from the DPWD mode.

FIG. 23 is a circuit diagram showing a configuration of a POR circuit in accordance with the sixth embodiment of the present invention. FIG. 24 shows simulated waveforms obtained from the POR circuit of the sixth embodiment when the power is turned on, with the voltage rise time $t_{ON}$ of 10 μs, and at restoration from the DPWD mode.

In FIG. 23, elements that are the same as or correspond to those shown in FIG. 19 are indicated by the same reference characters. The POR circuit of the sixth embodiment shown in FIG. 23 differs from the POR circuit of the fifth embodiment in these two points: the output inhibit circuit 110 is disposed instead of the output inhibit circuit 60 shown in FIG. 19; the switching circuit 120 is disposed between the second node n2 and the ground line GL.

The output inhibit circuit 110 connects the second node n2 to the power supply line PL through the resistor 21 when the DPWD signal input to the DPWD input port 31 is low. When the DPWD signal is high, the output inhibit circuit 110 isolates the second node n2 from the power supply line PL. The output inhibit circuit 110 is the PMOS transistor 111 which is connected in series with the resistor 21 and has a gate coupled to the DPWD input port 31. However, the output inhibit circuit 110 may be another circuit element having the similar switching function.

The switching circuit 120 is connected between the second node n2 and the ground line GL. The switching circuit 120 turns off when the DPWD signal input to the DPWD input port 31 is low and turns on when the DPWD signal is high. The switching circuit 120 is the NMOS transistor 121 having a gate coupled to the DPWD input port 31. However, the switching circuit 120 may be another circuit element having the similar switching function.

In the DPWD mode, the DPWD signal is at high level, the PMOS transistor 111 is in the off-state, and the NMOS transistor 121 is in the on-state. As shown in FIG. 24, while the POR circuit is in the steady state of the DPWD mode, both the voltage at the second node n2 and the voltage at the first node n1 are ground voltage VSS. At restoration from the DPWD mode, the first node n1 is quickly charged through the NMOS transistors 55 and 51, and the voltage at the first node n1 reaches the high level. As a result, the NMOS transistor 22 turns on. At restoration from the DPWD mode, the PMOS transistor 111 turns on, and the NMOS transistor 121 turns off. Because the NMOS transistor 22 is kept on, the voltage at the second node n2 is held low. As has been described above, the POR output from the POR output port 32 of the POR circuit of the sixth embodiment does not contain an edge waveform (a reset signal) at restoration from the DPWD mode.

Figures 25A, 25B, 25C:
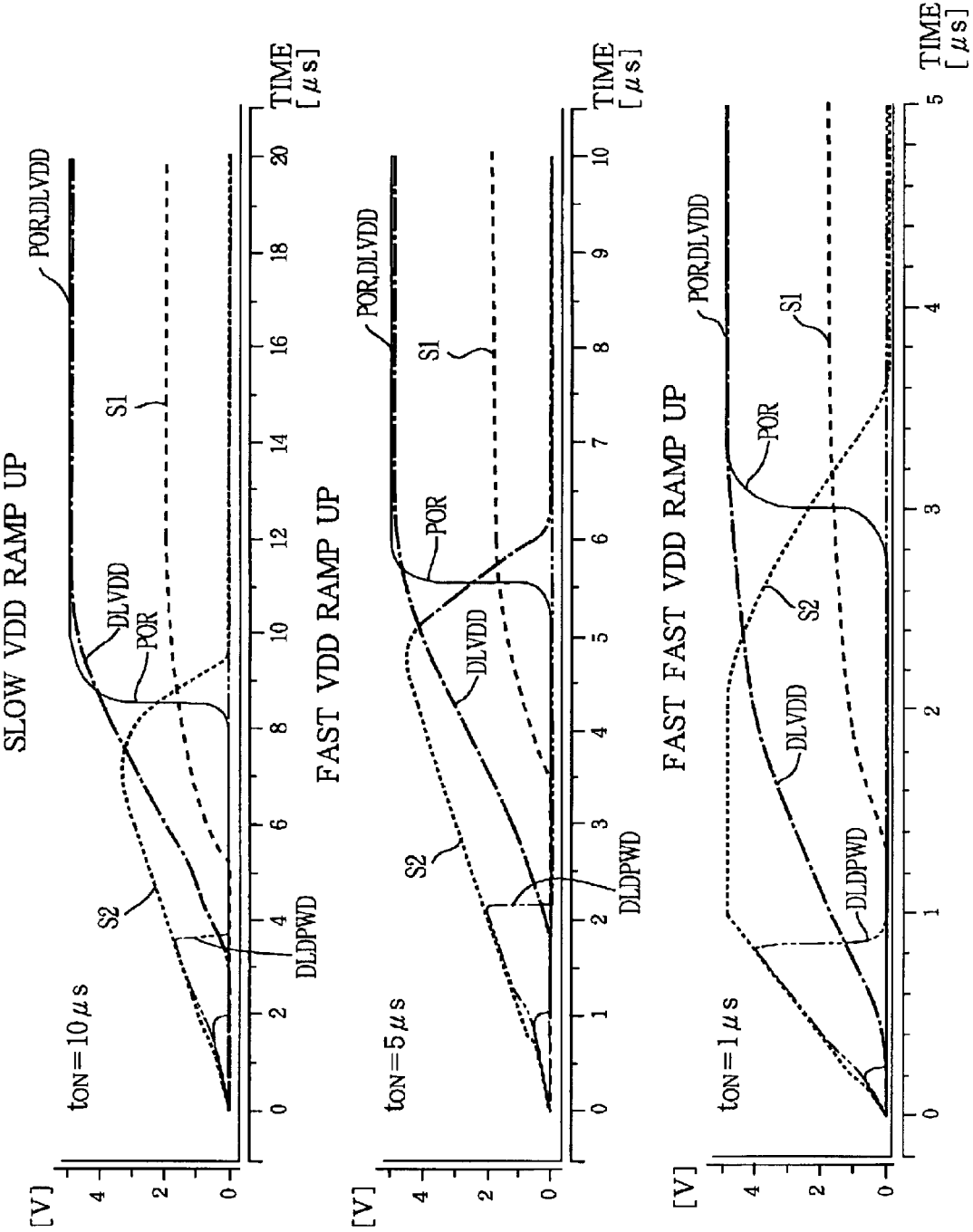
FIGS. 25A, 25B, and 25C show simulated waveforms obtained from the POR circuit of the sixth embodiment when the power is turned on, with the voltage rise time of 10 $\mu$s, 5 $\mu$s, and 1 $\mu$s, respectively.

The operation when the power is turned on in the sixth embodiment is the same as the operation in the fifth embodiment. FIGS. 25A, 25B, and 25C show simulated waveforms obtained from the POR circuit of the sixth embodiment when the power is turned on, with the voltage rise time $t_{ON}$ of 10 μs, 5 μs, and 1 μs, respectively. The results shown in FIGS. 25A, 25B, and 25C indicate that the POR circuit of the sixth embodiment can output a reset signal from the POR output port 32 if the voltage rise time $t_{ON}$ when the power is turned on is at least 1 μs or more.

Except for the points described above, the sixth embodiment is the same as the first to fifth embodiments described earlier.

FIG. 26 is a circuit diagram showing a configuration of a variation of the POR circuit of the sixth embodiment. As shown in FIG. 26, the switching circuits 110 and 120 of the sixth embodiment may be applied to the first embodiment. However, the switching circuits 110 and 120 of the sixth embodiment may also be applied to any of the second to fourth embodiments.

<Seventh Embodiment>

Figure 27:
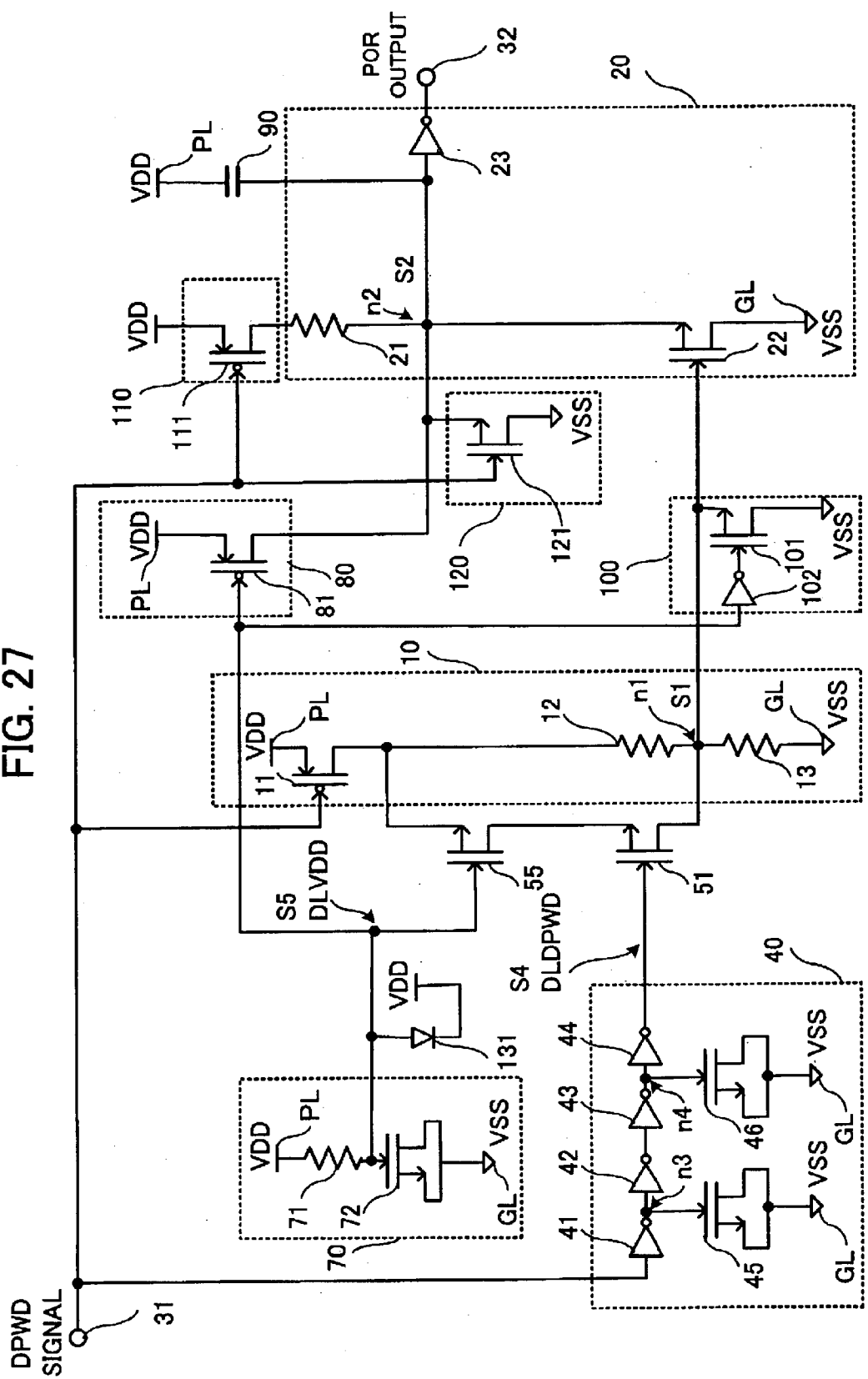
FIG. 27 is a circuit diagram showing a configuration of a POR circuit in accordance with the seventh embodiment of the present invention.
Figure 28:
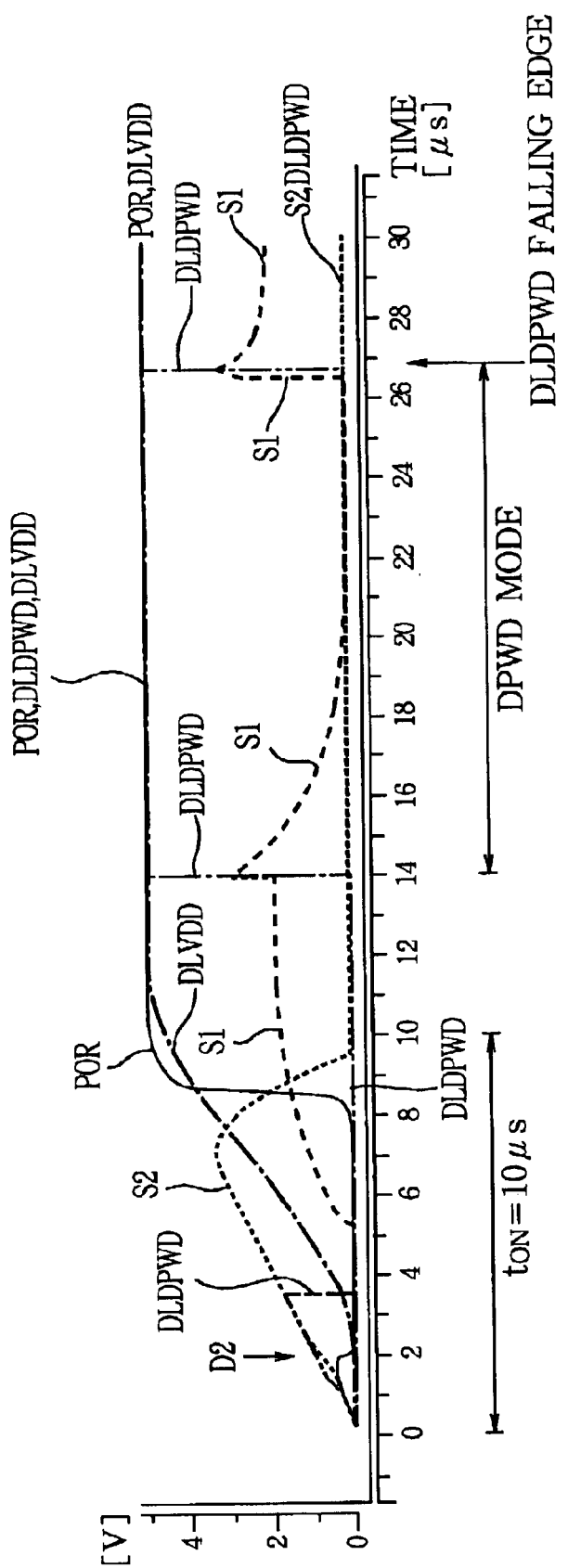
FIG. 28 shows simulated waveforms obtained from the POR circuit of the seventh embodiment when the power is turned on, with the voltage rise time of 10 $\mu$s, and at restoration from the DPWD mode.

FIG. 27 is a circuit diagram showing a configuration of a POR circuit in accordance with the seventh embodiment of the present invention. FIG. 28 shows simulated waveforms obtained from the POR circuit of the seventh embodiment when the power is turned on, with the voltage rise time $t_{ON}$ of 10 μs, and at restoration from the DPWD mode.

In FIG. 27, elements that are the same as or correspond to those shown in FIG. 23 are indicated by the same reference characters. The POR circuit of the seventh embodiment shown in FIG. 27 differs from the POR circuit of the sixth embodiment in that the PN diode 131 is disposed with its anode coupled to the power supply line PL and its cathode coupled to the output end of the VDD delay circuit 70. The POR circuit of the seventh embodiment can reliably output a reset signal even when the supply voltage VDD of the power supply line PL momentarily decreases and then immediately increases.

Figure 29A:
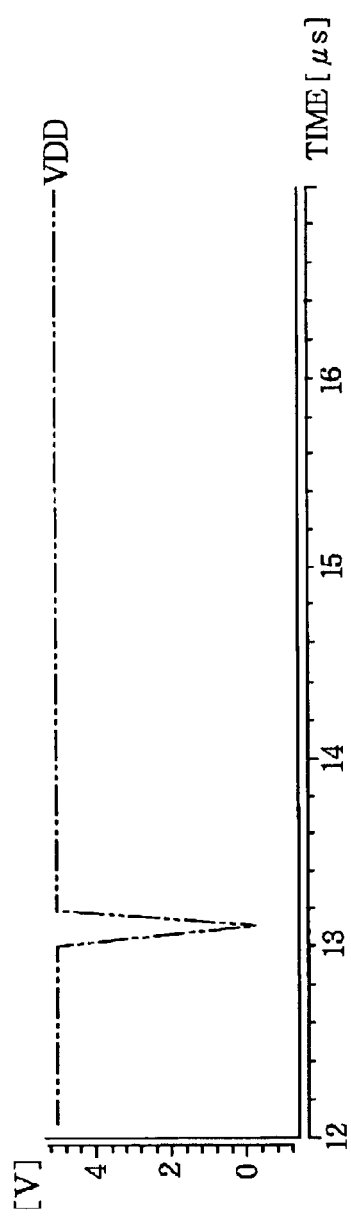
FIGS. 29A, 29B, and 29C show waveforms for describing the function of a diode in the POR circuit of the seventh embodiment.
Figure 29B:
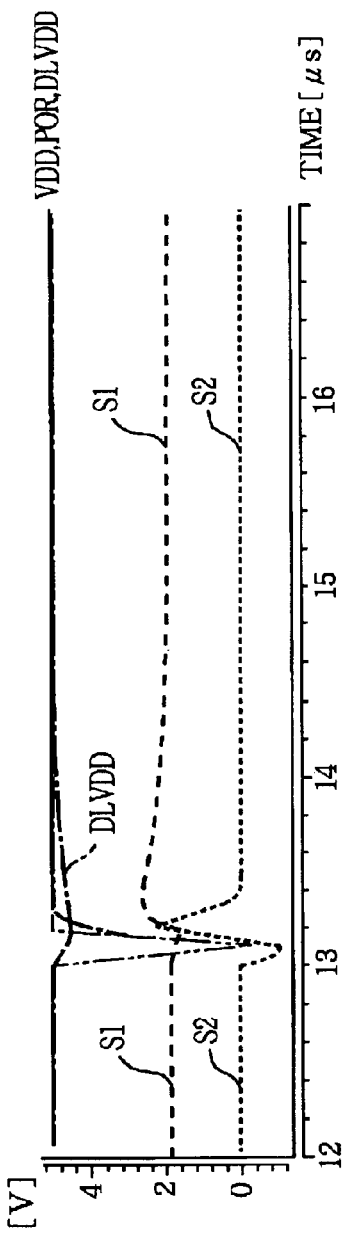
Figure 29C:
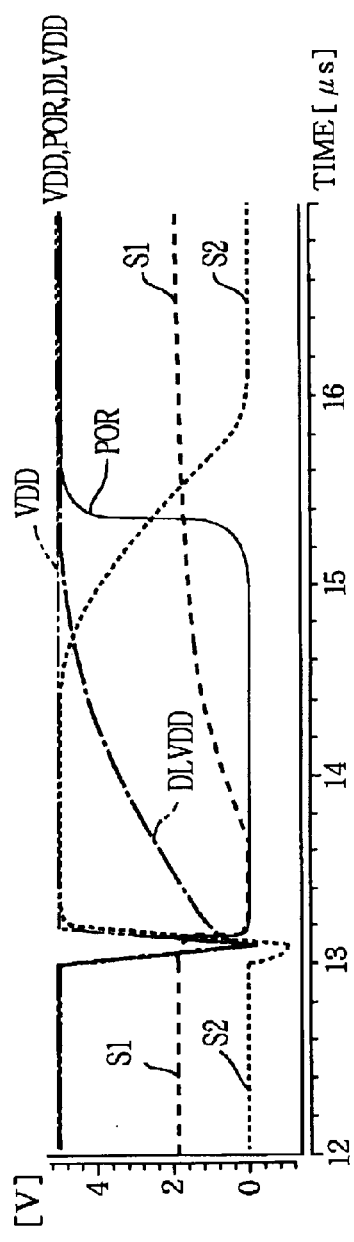

FIGS. 29A, 29B, and 29C show waveforms for describing the function of a diode 131 in the POR circuit of the seventh embodiment. The POR circuits of the first to sixth embodiments do not generate a reset signal because the voltage of the DLVDD signal S5 decreases too slightly, as shown in FIG. 29B, when the supply voltage VDD momentarily decreases in the power-on state, as shown in FIG. 29A. In the POR circuit of the seventh embodiment, however, when the supply voltage VDD momentarily decreases in the power-on state, as shown in FIG. 29A, the DLVDD signal S5 discharges through the diode 131. As shown in FIG. 29C, the voltage of the DLVDD signal S5 extensively decreases and goes low, then goes high again.

In the POR circuit of the seventh embodiment, when the supply voltage VDD momentarily decreases to cause the DLVDD signal S5 to decrease extensively and go low, the PMOS transistor 81 and the NMOS transistor 101 turn on. Consequently, the voltage at the first node n1 becomes 0 V, the NMOS transistor 22 turns off, and the second node n2 is rapidly charged to exceed the voltage level of the first node n1. The subsequent operation is the same as the normal voltage rising edge operation when the power is turned on. As the voltage of the second signal S2 at the second node n2 decreases, a reset signal is formed (at about a time point of 15.4 μs on the time axis in FIG. 29C).

As has been described above, the POR circuit of the seventh embodiment can reliably output a reset signal even if a power-on operation is made immediately after a power-off operation or in an instantaneous interruption when the supply voltage VDD momentarily decreases and is restored.

Figures 30A, 30B, 30C:
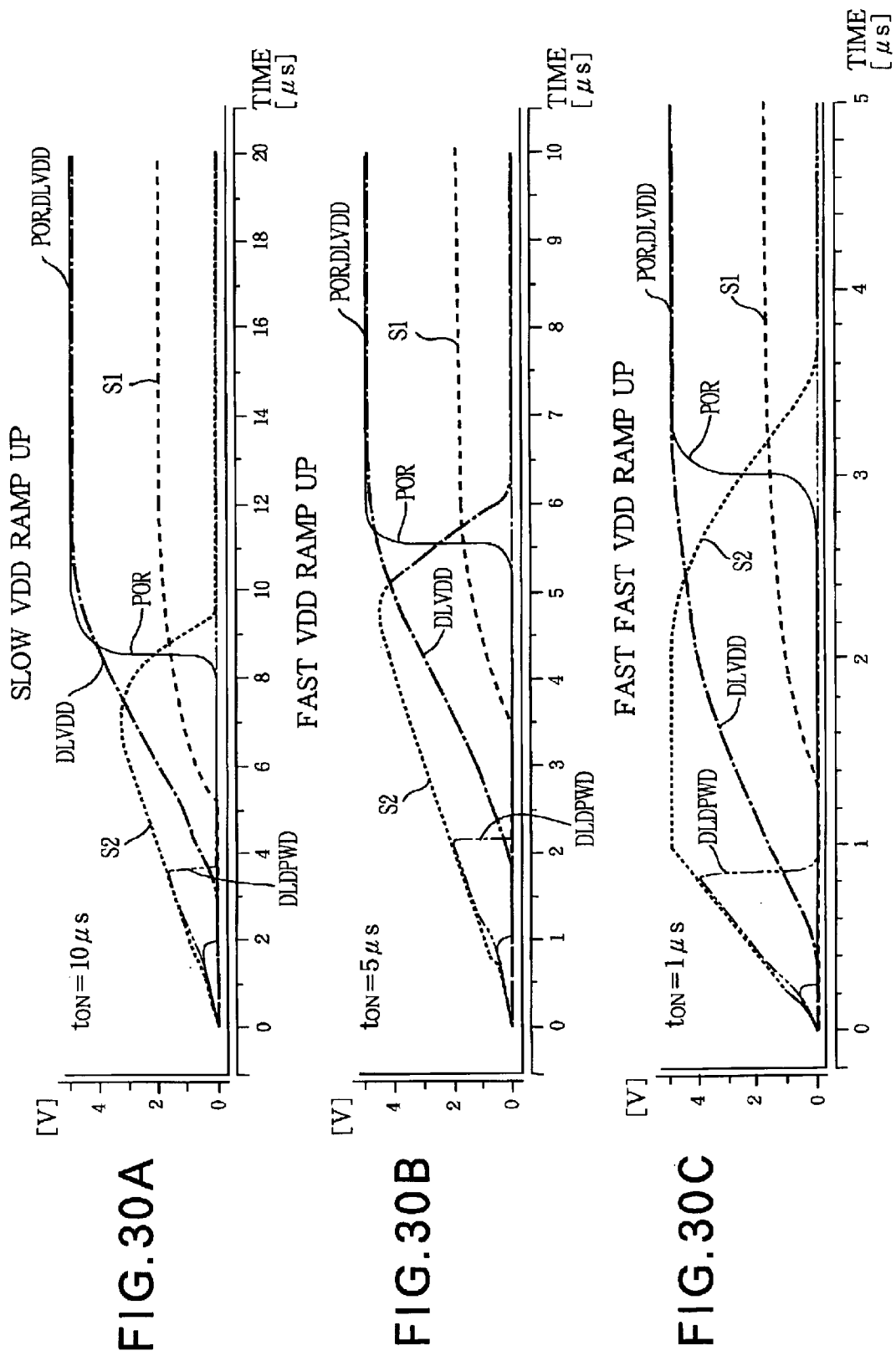
FIGS. 30A, 30B, and 30C show simulated waveforms obtained from the POR circuit of the seventh embodiment when the power is turned on, with the voltage rise time of 10 $\mu$s, 5 $\mu$s, and 1 $\mu$s, respectively.

FIGS. 30A, 30B, and 30C show simulated waveforms obtained from the POR circuit of the seventh embodiment when the power is turned on, with the voltage rise time $t_{ON}$ of 10 μs, 5 μs, and 1 μs, respectively. The results shown in FIGS. 30A, 30B, and 30C indicate that the POR circuit of the sixth embodiment can output a reset signal from the POR output port 32 if the voltage rise time $t_{ON}$ when the power is turned on is at least 1 μs or more.

Except for the points described above, the seventh embodiment is the same as the first to sixth embodiments described earlier.

Figure 31:
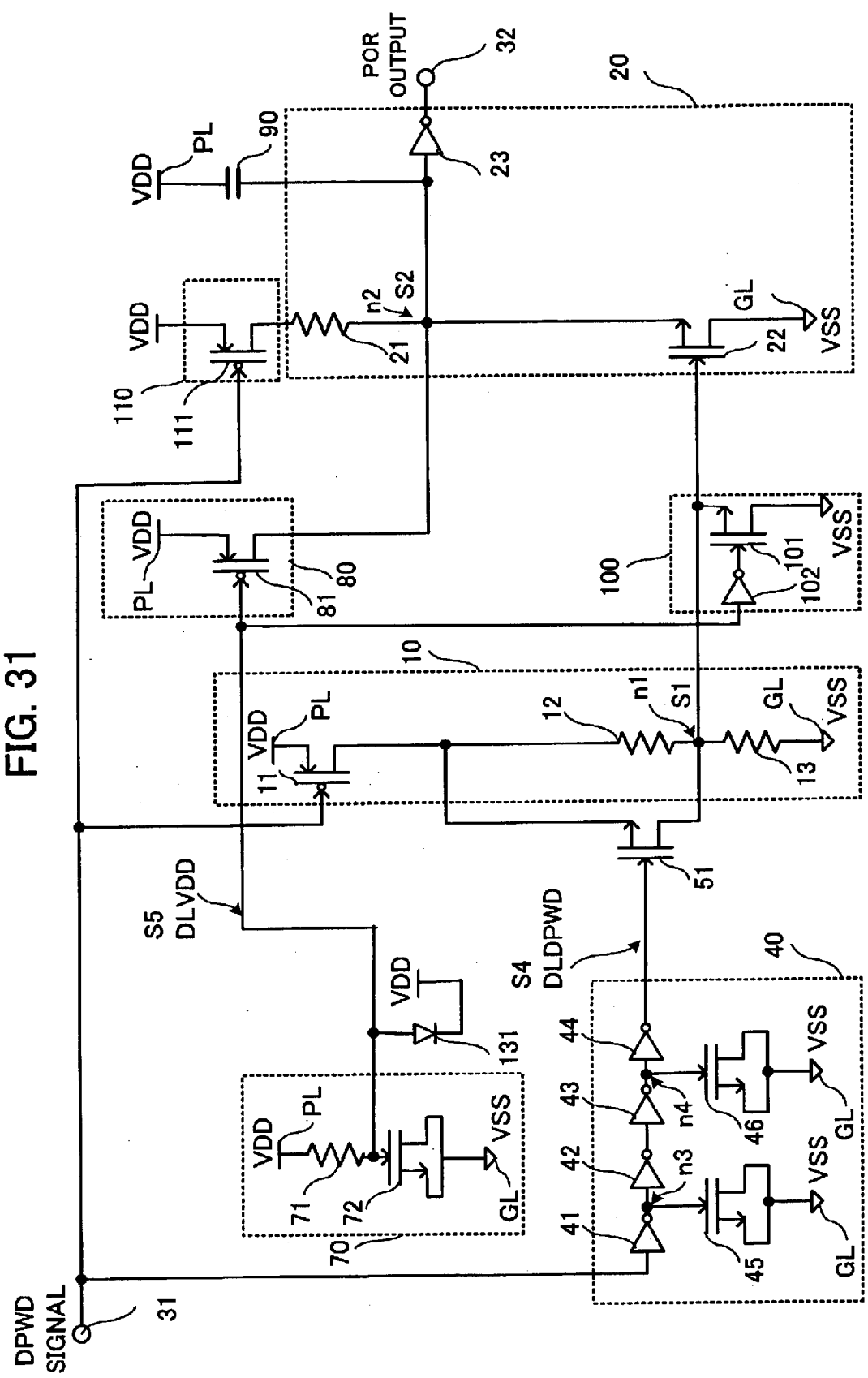
FIG. 31 is a circuit diagram showing a configuration of a variation of the POR circuit of the seventh embodiment.

FIG. 31 is a circuit diagram showing a configuration of a variation of the POR circuit of the seventh embodiment. In the description above, the diode 131 of the POR circuit of the seventh embodiment has been applied to the sixth embodiment. However, the diode 131 of the seventh embodiment may also be applied to any of the first to fifth embodiments.

<Eighth Embodiment>

Figure 32:
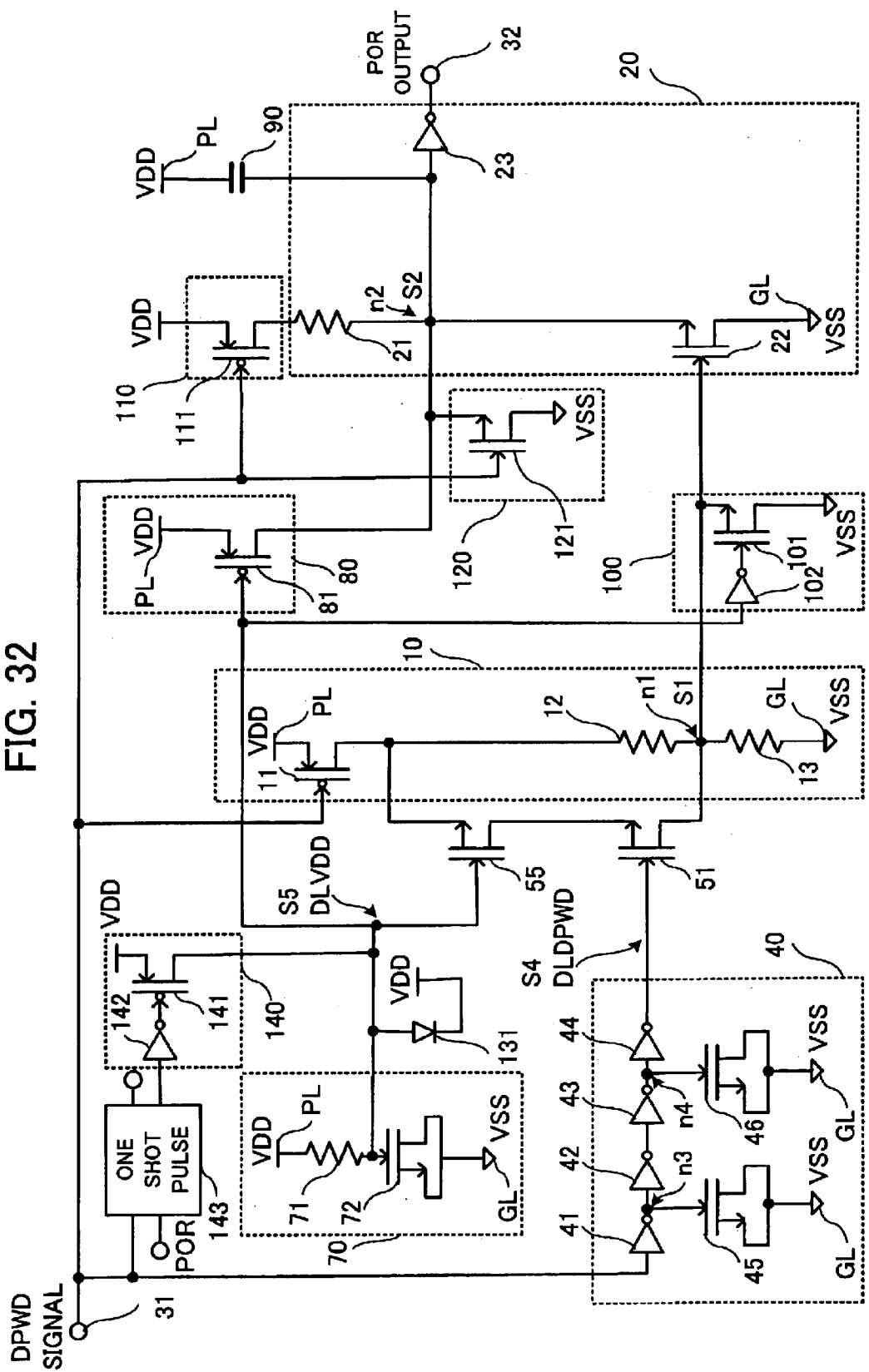
FIG. 32 is a circuit diagram showing a configuration of a POR circuit in accordance with the eighth embodiment of the present invention.
Figure 33:
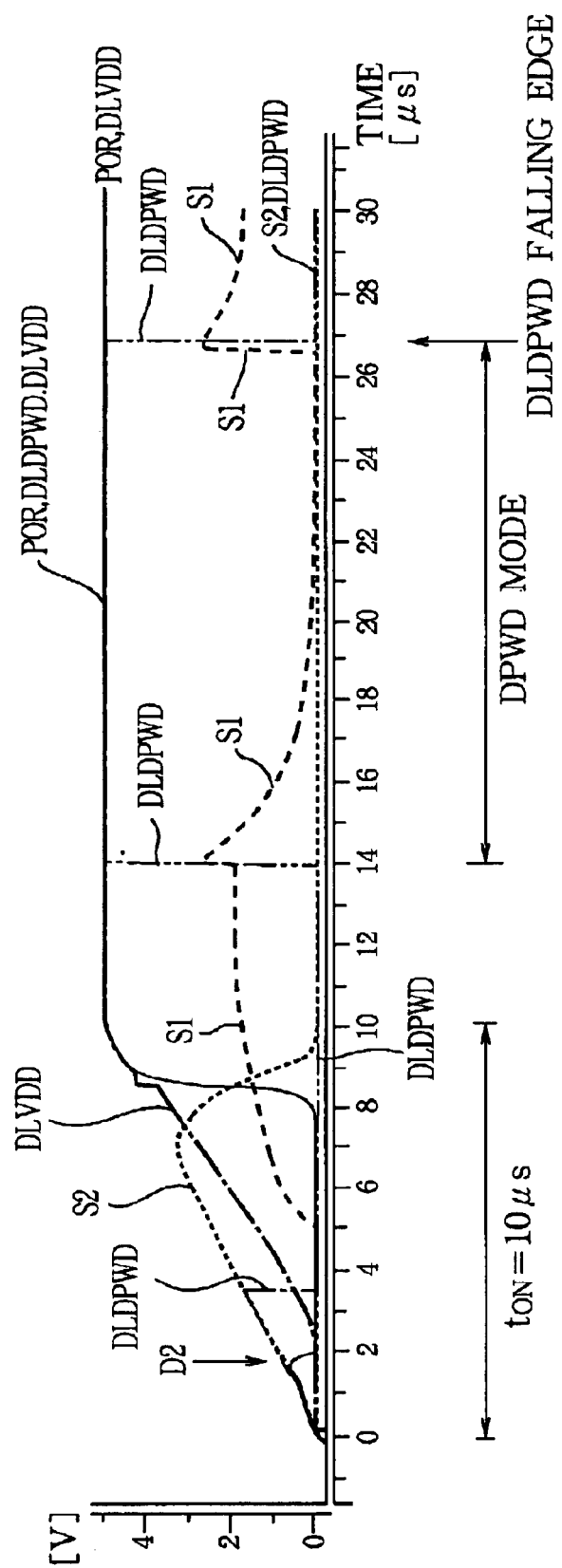
FIG. 33 shows simulated waveforms obtained from the POR circuit of the eighth embodiment when the power is turned on, with the voltage rise time of 10 $\mu$s, and at restoration from the DPWD mode.

FIG. 32 is a circuit diagram showing a configuration of a POR circuit in accordance with the eighth embodiment of the present invention. FIG. 33 shows simulated waveforms obtained from the POR circuit of the eighth embodiment when the power is turned on, with the voltage rise time $t_{ON}$ of 10 μs, and at restoration from the DPWD mode.

In FIG. 32, elements that are the same as or correspond to those shown in FIG. 26 are indicated by the same reference characters. The POR circuit of the eighth embodiment shown in FIG. 32 differs from the POR circuit of the sixth embodiment in that a one-shot pulse generator 143 and a switching circuit 140 are provided. The one-shot pulse generator 143 outputs a prescribed voltage (5 V, for instance) for a prescribed period when a high-to-low transition is detected on the DPWD signal input to the DPWD input port 31. The switching circuit 140 is coupled between the ground line GL and the output end of the VDD delay circuit 70 and turns on while the voltage output from the one-shot pulse generator 143 is held high. The switching circuit 140 includes the PMOS transistor 141 and the inverter 142. The PMOS transistor 141 is coupled between the ground line GL and the output end of the VDD delay circuit 70. The inverter 142 inputs a reversal of the prescribed voltage to the gate of the PMOS transistor 141.

FIG. 34A shows how the supply voltage VDD, the DLVDD signal, and the reset signal of the POR circuits of the first to seventh embodiments change at restoration from the power-saving mode, in which the supply voltage VDD is held low. As shown in FIG. 34A, the supply voltage VDD is rapidly restored from 2 V to the normal level of 5 V, but the delayed signal DLVDD is restored to about 5 V with a delay of 2 µs at least. Because this state is the same as a normal rising edge in supply voltage, a low-to-high transition (edge) A1 occurs in the reset signal.

In the POR circuit of the eighth embodiment, however, the one-shot pulse generator 143 outputs a one-shot pulse PUL, which is held high for a prescribed period, when the DPWD signal increasing in the same fashion as the supply voltage VDD ramps up and the DPWD mode is cancelled, as shown in FIG. 34B. The one-shot pulse PUL is inverted by the inverter 142 and input to the gate of the PMOS transistor 141. This turns on the PMOS transistor 141. As a result, when the supply voltage VDD is restored to the normal level of 5 V, the voltage of the DLVDD signal also becomes 5 V. Therefore, a low-to-high transition A1 does not occur in the reset signal.

As has been described above, the POR circuit of the eighth embodiment can avoid the erroneous output of a reset signal at restoration from the power-saving mode even if the semiconductor integrated circuit is a power-saving mode, in which the supply voltage is kept low.

Figures 35A, 35B, 35C:
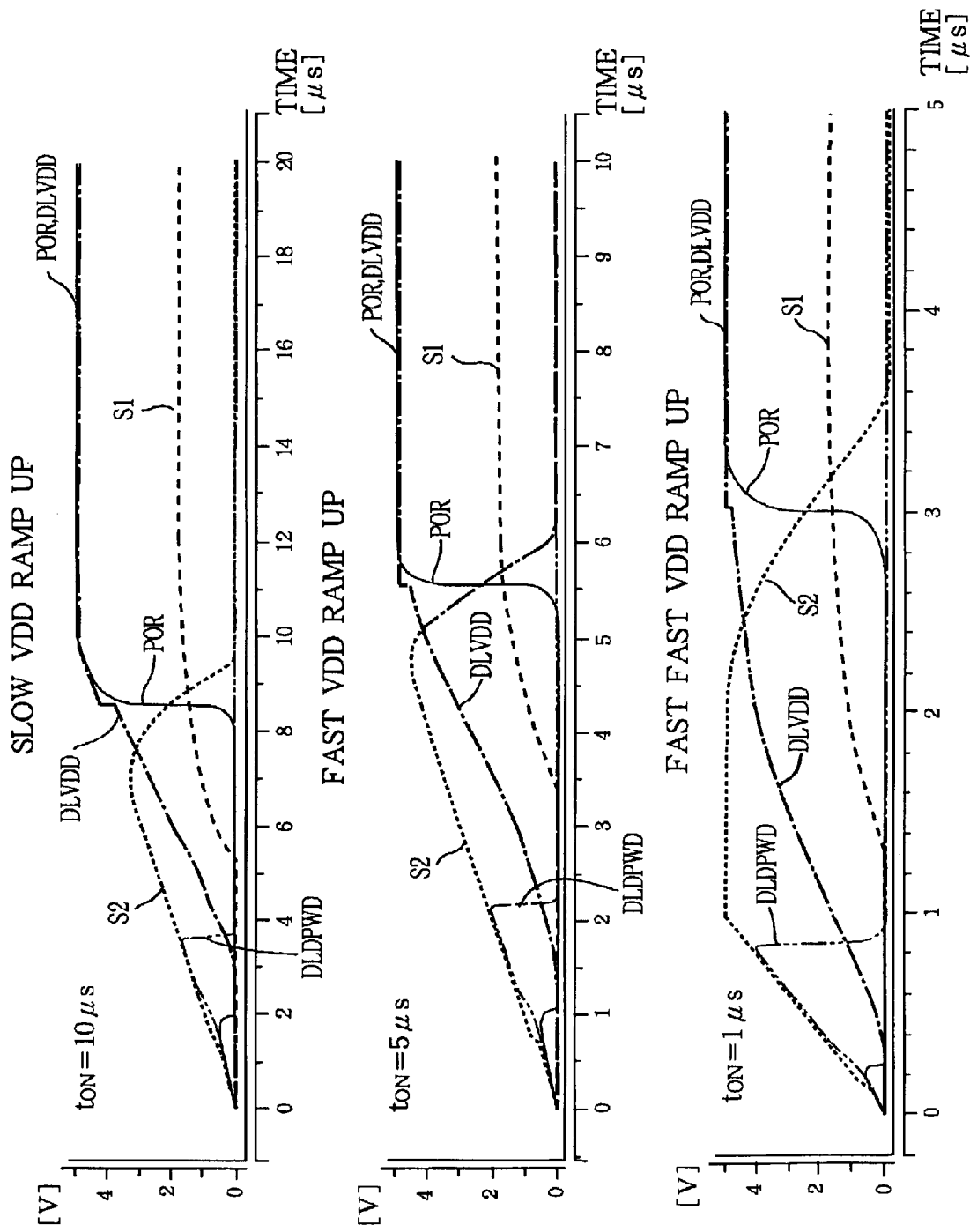
FIGS. 35A, 35B, and 35C show simulated waveforms obtained from the POR circuit of the eighth embodiment when the power is turned on, with the voltage rise time of 10 s, 5 $\mu$s, and 1 $\mu$s, respectively.

FIGS. 35A, 35B, and 35C show simulated waveforms obtained from the POR circuit of the eighth embodiment when the power is turned on, with the voltage rise time $t_{ON}$ of 10 µs, 5 µs, and 1 µs, respectively. The results shown in FIGS. 35A, 35B, and 35C indicate that the POR circuit of the eighth embodiment can output a reset signal from the POR output port 32 if the voltage rise time $t_{ON}$ when the power is turned on is at least 1 µs or more.

Except for the points described above, the eighth embodiment is the same as the first to seventh embodiments described earlier.

Figure 36:
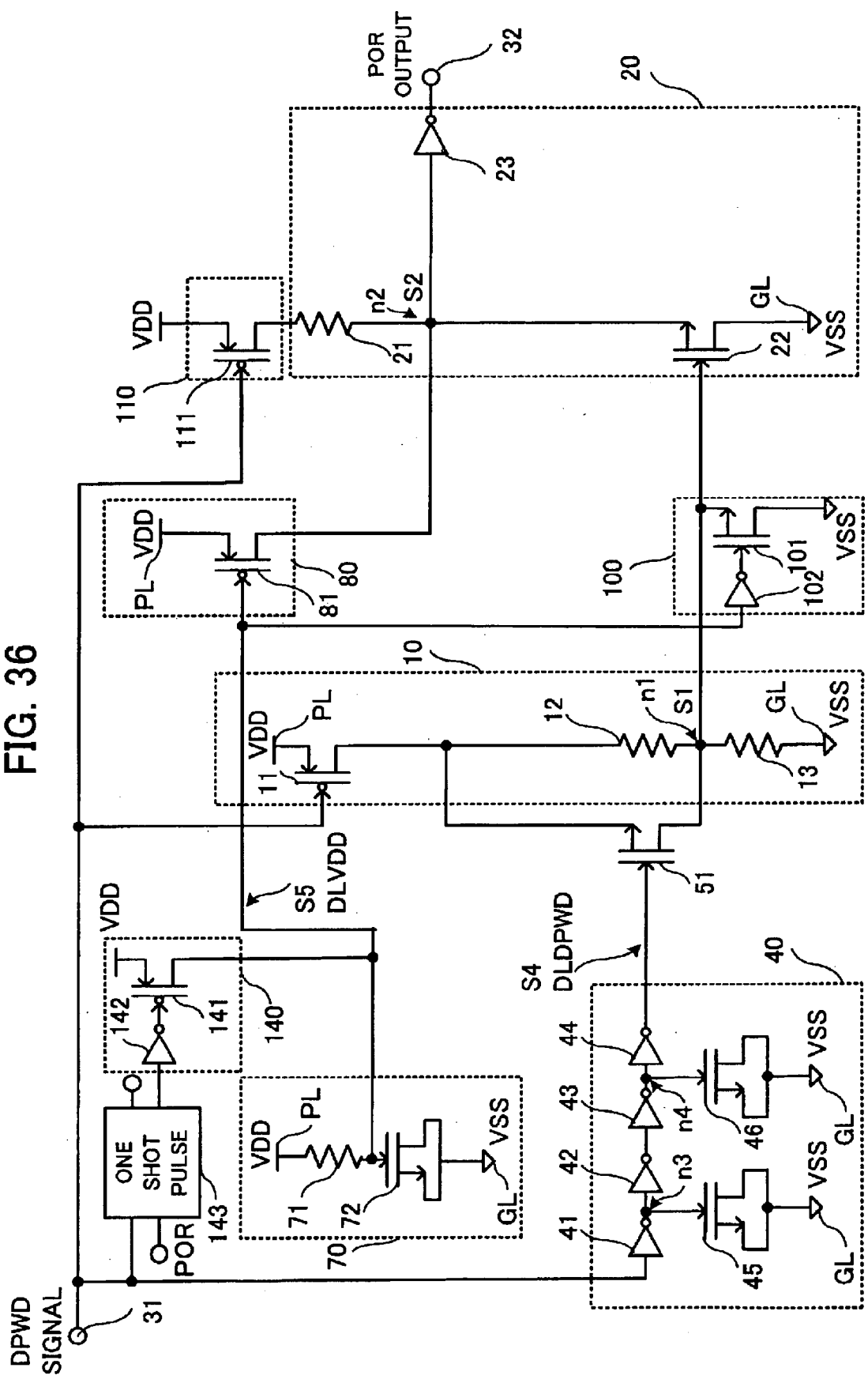
FIG. 36 is a circuit diagram showing a configuration of a variation of the POR circuit of the eighth embodiment.

FIG. 36 is a circuit diagram showing a configuration of a variation of the POR circuit of the eighth embodiment. As shown in FIG. 36, the one-shot pulse generator 143 and the switching circuit 140 of the eighth embodiment may be applied to any of the first to sixth embodiments.

<Comparison of Embodiments>

FIG. 37A shows a waveform of the DPWD signal. FIGS. 37B to 37K show waveforms of simulated POR output of the POR circuits of conventional art and of the first to eighth embodiments respectively when the power is turned on, with the voltage rise time of 10 µs, and at restoration from the DPWD mode. The waveforms shown in FIGS. 37A to 37K indicate that no reset signal is output at restoration from the DPWD mode in the first to eighth embodiments of the present invention and the variation of the first embodiment. The waveforms shown in FIGS. 37B to 37K indicate that a reset signal A0 is output when the power is turned on in the first to eighth embodiments (except for the variation of the first embodiment).

FIGS. 38A to 38J show the waveforms of simulated POR output of the POR circuits of conventional art and of the first to eighth embodiments respectively, when the power is turned on, with the voltage rise time is 5 µs. The waveforms shown in FIGS. 38B to 38K indicate that a reset signal A0 is output when the power is turned on in the third to eighth embodiments.

In the first to eighth embodiments, the description relates to the components such as the output inhibit circuits 60 and 110, the charging circuits 51 and 52, and the delay circuits 40 and 70 for resolving the problems of the POR circuit shown in FIG. 1. However, the present invention can be applied to other POR circuits that operate in a similar manner to the POR circuit shown in FIG. 1.

The invention being thus described, it will be obvious that the same may be varied in many ways. Such variations are not to be regarded as a departure from the spirit and scope of the invention, and all such modifications as would be obvious to one skilled in the art are intended to be included within the scope of following claims.

What is claimed is:

1. A power on reset circuit comprising:
   a power supply line;
   a first port to which a power-saving mode signal is input;
   a second port from which a reset signal is output;
   a signal generator which is controlled in accordance with the power-saving mode signal to generate a control signal;
   an edge generator which is controlled in accordance with the control signal to generate an edge signal;
   a first delay circuit which outputs a delayed power-saving mode signal obtained by delaying the power-saving mode signal;
   a charging circuit which is controlled in accordance with the delayed power-saving mode signal to speed up an increase of a level of the control signal; and
   an output inhibit circuit coupled to the output of the edge generator and which outputs an edge waveform as a reset signal from said second port during a period of changing from a power-off state, in which no power is supplied to said power supply line, to a power-on state, in which power is supplied to said power supply line, and does not output the reset signal from said second port when a voltage of the power-saving mode signal is changed.

2. The power on reset circuit according to claim 1, wherein
   the power-saving mode is mode for reducing power consumption of said signal generator and said edge generator; and
   the power-saving mode signal has one of a voltage for instructing turn-on of the power-saving mode or a voltage for instructing turn-off of the power-saving mode.

3. The power on reset circuit according to claim 1, wherein said signal generator includes a first switching circuit, a first resistor, and a second resistor connected in series.

4. The power on reset circuit according to claim 3, wherein said first node is a node between said first resistor and said second resistor.

5. The power on reset circuit according to claim 3, wherein said charging circuit includes a first NMOS transistor connected in parallel to said first resistor, said first NMOS transistor having a gate to receive the delayed power-saving mode signal output from said first delay circuit.

6. The power on reset circuit according to claim 3, wherein said charging circuit includes:

an inverter which outputs a reversal of the delayed power-saving mode signal output from said first delay circuit; and a PMOS transistor connected in parallel to said first resistor, said PMOS transistor having a gate to receive the delayed power-saving mode signal output from said first delay circuit.

7. The power on reset circuit according to claim 3, wherein said edge generator includes a third resistor and a second switching circuit connected in series, and a first inverter coupled to a node between said third resistor and said second switching circuit.

8. The power on reset circuit according to claim 7, wherein said second switching circuit is controlled in accordance with a voltage of the first signal which is the control signal generated by said signal generator.

9. The power on reset circuit according to claim 8, wherein a second signal having an edge waveform is generated at a second node between said third resistor and said second switching circuit when said second switching circuit turns on, and said first inverter outputs a third signal which is a reversal of the second signal generated at said second node.

10. The power on reset circuit according to claim 7, wherein said power line includes a first power supply line to which a first voltage is applied, and a second power supply line to which a second voltage is applied;

a voltage of the power-saving mode signal is one of a third voltage or a fourth voltage; and said output inhibit circuit outputs an edge waveform contained in a third signal as a reset signal from said second port when the power-off state, in which both said first power supply line and said second power supply line are carrying a ground voltage, changes to the power-on state, in which said first power supply line and said second power supply line have a prescribed voltage difference, and does not output the reset signal from said second port when the voltage at said first port changes from the fourth voltage to the third voltage.

11. The power on reset circuit according to claim 3, wherein said first switching circuit includes a first PMOS transistor which has a gate coupled to said first port.

12. The power on reset circuit according to claim 7, wherein said second switching circuit includes a second NMOS transistor which has a gate coupled to said first node.

13. The power on reset circuit according to claim 10, wherein said output inhibit circuit receives the third signal as an output from said first inverter and the delayed power-saving mode signal as a fourth signal output from said first delay circuit, passes an edge waveform included in the third signal output from the first inverter as a reset signal when changing from the power-off state to the power-on state, and does not pass the reset signal output from said first inverter when the voltage at said first port changes from the fourth voltage to the third voltage.

14. The power on reset circuit according to claim 10, wherein said output inhibit circuit is a third switching circuit, which connects a second node between said third resistor and said second switching circuit through said third resistor to said power supply line when the voltage at said first port is the third voltage, and isolates said second node from said power supply line when the voltage at said first port is the fourth voltage.

15. The power on reset circuit according to claim 13, wherein said third switching circuit includes a second PMOS transistor which is connected in series with said third resistor and has a gate coupled to said first port.

16. The power on reset circuit according to claim 10, further comprising:

a second delay circuit which generates a fifth signal by delaying a waveform of said second voltage; and a fourth switching circuit which is connected in series with said charging circuit and controlled by the fifth signal, and delays a timing at which application of the second voltage of said power supply line to said charging circuit starts during a change from the power-off state to the state.

17. The power on reset circuit according to claim 16, wherein said fourth switching circuit includes a third NMOS transistor having a gate to which the fifth signal is input.

18. The power on reset circuit according to claim 10, further comprising:

a second delay circuit which generates a fifth signal by delaying a waveform of said second voltage; and a fifth switching circuit which is connected between said second power supply line and said second node and continues charging said second node until a voltage of said fifth signal reaches a prescribed level during a change from the power-off state to the power-on state.

19. The power on reset circuit according to claim 18, wherein said fifth switching circuit includes a third PMOS transistor including a gate to which the fifth signal is input.

20. The power on reset circuit according to claim 18, further comprising a diode which includes an anode coupled to said second power supply line and a cathode coupled to an output end of said second delay circuit.

21. The power on reset circuit according to claim 18, further comprising:

a one-shot pulse generator which outputs a fifth voltage for a prescribed period when a transition from the fourth voltage to the third voltage is detected at said first port; and a sixth switching circuit which is connected between said first power supply line and the output end of said second delay circuit and turns on while said one-shot pulse generator is outputting the fifth voltage.

22. The power on reset circuit according to claim 10, further comprising a capacitor connected between said second power supply line and said second node.

23. The power on reset circuit according to claim 10, further comprising:

a second delay circuit which generates a fifth signal by delaying a waveform of said second voltage; and a seventh switching circuit which is connected between said first node and said first power supply line and continues discharging said first node until the voltage of said fifth signal reaches a prescribed level during a change from the power-off state to the power-on state.

24. The power on reset circuit according to claim 23, wherein said seventh switching circuit includes:

a fourth NMOS transistor connected between said first node and said first power supply line; and a second inverter which outputs a reversal of the fifth signal to the gate of said fourth NMOS transistor.

25. The power on reset circuit according to claim 10, further comprising:

an eighth switching circuit which is connected between said second node and said first power supply line, and turns off when the voltage at said first port is the third voltage and turns on when the voltage said first port is the fourth voltage.

26. The power on reset circuit according to claim 25, wherein the first voltage is the ground voltage;

the second voltage is an adjustable voltage; and said eighth switching circuit includes a fifth NMOS transistor including a gate coupled to said first port.

27. The power on reset circuit according to claim 25, further comprising a diode which includes an anode couple to said second power supply line and a cathode coupled to an output end of said second delay circuit.

28. The power on reset circuit according to claim 25, further comprising:

a one-shot pulse generator which outputs a fifth voltage for a prescribed period when a transition from the fourth voltage to the third voltage is detected at said first port; and a sixth switching circuit which is connected between said first power supply line and the output end of said second delay circuit and turns on while said one-shot pulse generator is outputting the fifth voltage.

* * * * *